(12) United States Patent
Jung et al.

(10) Patent No.: US 11,368,125 B2
(45) Date of Patent: Jun. 21, 2022

(54) CRYSTAL OSCILLATOR REDUCING PHASE NOISE AND SEMICONDUCTOR CHIP INCLUDING THE SAME

(71) Applicant: Samsung Electronics Co., Ltd., Suwon-si (KR)

(72) Inventors: Jaehong Jung, Bucheon-si (KR); Wonkang Kim, Gunpo-si (KR); Seungjin Kim, Yongin-si (KR); Seunghyun Oh, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/340,593

(22) Filed: Jun. 7, 2021

(65) Prior Publication Data
US 2022/0094302 A1 Mar. 24, 2022

(30) Foreign Application Priority Data
Sep. 18, 2020 (KR) .................. 10-2020-0120637

(51) Int. Cl.
| | | |
|---|---|---|
| *H03B 5/36* | (2006.01) | |
| *H03K 5/159* | (2006.01) | |
| *G06F 1/10* | (2006.01) | |
| *H03K 5/00* | (2006.01) | |

(52) U.S. Cl.
CPC .............. *H03B 5/36* (2013.01); *G06F 1/10* (2013.01); *H03K 5/159* (2013.01); *H03B 2200/004* (2013.01); *H03K 2005/00078* (2013.01)

(58) Field of Classification Search
CPC ......... H03K 5/159; H03K 2005/00078; H03B 2200/004; H03B 5/36; G06F 1/10

USPC ........................... 331/185, 182, 158, 116 FE
See application file for complete search history.

(56) References Cited

U.S. PATENT DOCUMENTS

| | | | |
|---|---|---|---|
| 7,138,881 B2 | 11/2006 | Lin | |
| 7,266,349 B2 * | 9/2007 | Kappes | .................. H03B 5/06 455/73 |
| 7,292,114 B2 | 11/2007 | Greenberg | |
| 7,768,359 B2 | 8/2010 | Chang et al. | |

(Continued)

FOREIGN PATENT DOCUMENTS

KR 20-2000-0006239 U 4/2000

*Primary Examiner* — Arnold M Kinkead
(74) *Attorney, Agent, or Firm* — Harness, Dickey & Peirce, P.L.C.

(57) ABSTRACT

A crystal oscillator reducing phase noise and a semiconductor chip including the same are provided. The crystal oscillator includes a transconductance circuit electrically connected to a crystal, a load capacitor connected to the transconductance circuit, a feedback resistance circuit connected between an input terminal of the transconductance circuit and an output terminal of the transconductance circuit, the feedback resistance circuit configured to provide a feedback resistance, and a variable resistance controller configured to generate a resistance control signal for controlling the feedback resistance, the resistance control signal causing the feedback resistance to have a first value in a first period and a second value in a second period, the first value being less than the second value, the first period corresponding to a first portion of a cycle of the clock signal, and the second period corresponding to a second portion of the cycle different from the first portion.

20 Claims, 14 Drawing Sheets

(56) References Cited

U.S. PATENT DOCUMENTS

| | | | |
|---|---|---|---|
| 7,848,709 B2 * | 12/2010 | Kappes | H03B 5/06 |
| | | | 455/73 |
| 8,866,557 B2 | 10/2014 | Lee et al. | |
| 9,154,082 B2 | 10/2015 | Takahashi et al. | |
| 9,431,959 B2 | 8/2016 | Liu et al. | |
| 10,291,235 B2 | 5/2019 | Arai | |
| 2019/0007005 A1 | 1/2019 | Marques | |
| 2020/0313614 A1 * | 10/2020 | Sawada | H01L 23/528 |

* cited by examiner

CRYSTAL OSCILLATOR REDUCING PHASE NOISE AND SEMICONDUCTOR CHIP INCLUDING THE SAME

CROSS-REFERENCE TO RELATED APPLICATION

This application is based on and claims priority under 35 U.S.C. § 119 to Korean Patent Application No. 10-2020-0120637, filed on Sep. 18, 2020, in the Korean Intellectual Property Office, the disclosure of which is incorporated by reference herein in its entirety.

BACKGROUND

The inventive concepts relate to a crystal oscillator, and more particularly, to a crystal oscillator reducing phase noise and a semiconductor chip including the same.

A crystal oscillator may be used as a clock source. A clock signal (e.g., a reference clock signal) based on a crystal oscillator may be provided to various kinds of devices such as a radio frequency integrated chip (RFIC) and a serial communication device. For example, a crystal oscillator may include a crystal (or a crystal circuit) and an oscillation circuit driving the crystal, and may generate a clock signal having a frequency corresponding to a natural frequency of the crystal.

The frequency of a crystal oscillator may change according to a divergence, temperature, or the like of a crystal, and the crystal oscillator may compensate for a frequency change using a capacitor or the like. However, a load capacitance increases during the compensation, causing degradation of the phase noise performance of the crystal oscillator. As a result, the performance of devices receiving a reference clock signal from the crystal oscillator may also be degraded.

SUMMARY

The inventive concepts provide a crystal oscillator for reducing phase noise and enhancing the frequency characteristic of a clock signal, and a semiconductor chip including the crystal oscillator.

According to an aspect of the inventive concepts, there is provided a crystal oscillator configured to output a clock signal. The crystal oscillator includes a transconductance circuit electrically connected to a crystal, a load capacitor connected to the transconductance circuit, a feedback resistance circuit connected between an input terminal of the transconductance circuit and an output terminal of the transconductance circuit, the feedback resistance circuit configured to provide a feedback resistance, and a variable resistance controller configured to generate a resistance control signal for controlling the feedback resistance, the resistance control signal causing the feedback resistance to have a first value in a first period and a second value in a second period, the first value being less than the second value, the first period corresponding to a first portion of a cycle of the clock signal, and the second period corresponding to a second portion of the cycle different from the first portion.

According to an aspect of the inventive concepts, there is provided a crystal oscillator configured to output a clock signal. The crystal oscillator includes an oscillation circuit electrically connected to a crystal, the oscillation circuit including a load capacitor and a feedback resistance circuit, the load capacitor and the feedback resistance circuit being connected to a transconductance circuit, and the oscillation circuit configured to generate a sine wave signal by oscillating the crystal, a buffer configured to convert the sine wave signal into a square wave signal, and a variable resistance controller configured to generate a resistance control signal in response to a capacitance of the load capacitor, a resistance value of the feedback resistance circuit being based on the resistance control signal, the resistance control signal causing an average resistance value of the feedback resistance circuit when the load capacitor has a first capacitance to be lower than an average resistance value of the feedback resistance circuit when the load capacitor has a second capacitance, and the second capacitance being lower than the first capacitance.

According to an aspect of the inventive concepts, there is provided an electronic system including a crystal having a natural frequency, a crystal oscillator connected to the crystal, the crystal oscillator configured to generate a clock signal having a frequency corresponding to the natural frequency, and an application processor configured to control the crystal oscillator, wherein the crystal oscillator includes an oscillation circuit including a transconductance circuit, a load capacitor, and a feedback resistance circuit, the load capacitor being connected to the transconductance circuit, and the feedback resistance circuit providing a feedback resistance to the transconductance circuit, and a variable resistance controller configured to decrease a value of the feedback resistance in a first period and increase the value of the feedback resistance in a second period, the first period corresponding to a first portion of a cycle of the clock signal, and the second period corresponding to a second portion of the cycle of the clock signal different from the first portion, the application processor is configured to output a capacitor control signal for controlling a capacitance of the load capacitor, and a length of the first period is changed when the capacitance of the load capacitor is changed.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments will be described in detail with reference to the accompanying drawings.

Figure 1:
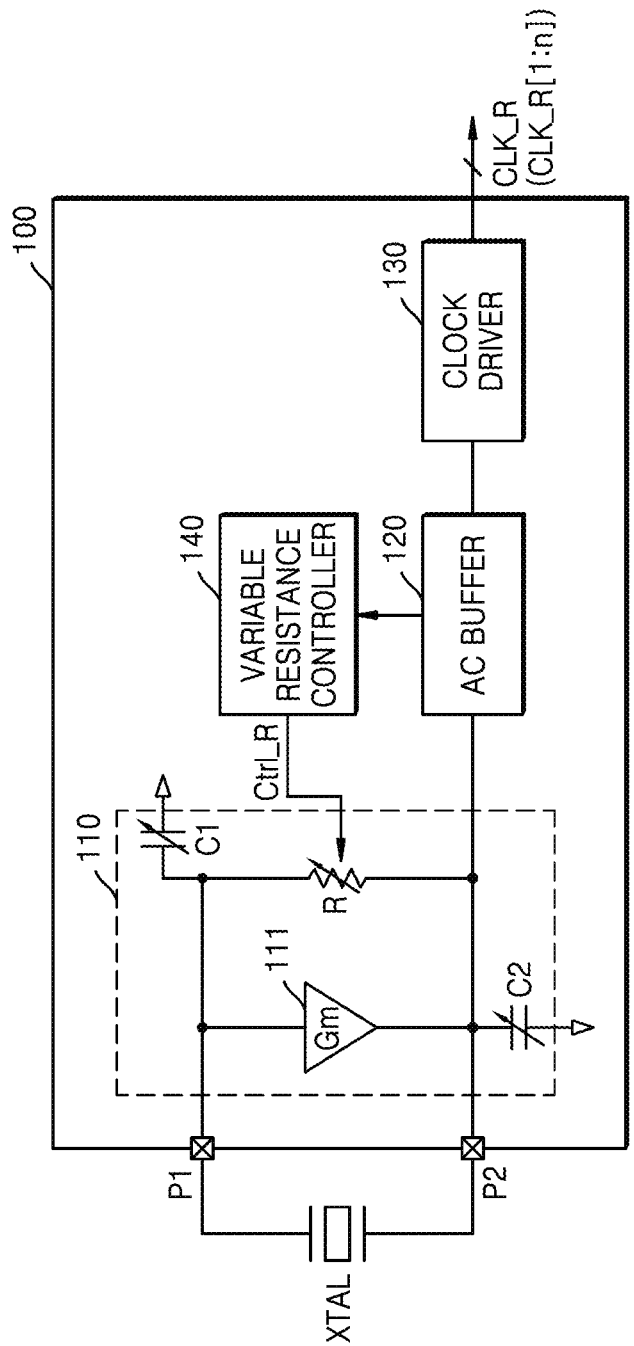
FIG. 1 is a block diagram of an implementation of a crystal oscillator according to example embodiments.

FIG. 1 is a block diagram of an implementation of a crystal oscillator according to example embodiments.

Referring to FIG. 1, a crystal oscillator 100 may include elements that generate a clock signal CLK_R by resonating of a crystal (or a crystal circuit) XTAL, wherein the clock signal CLK_R corresponds to a natural frequency (or resonant frequency) of the crystal XTAL. The clock signal CLK_R generated by the crystal oscillator 100 may be used as a reference clock signal used by other devices to generate a clock signal, and accordingly, the crystal oscillator 100 may be referred to as a reference clock generator. FIG. 1 shows an example in which the crystal XTAL is outside the crystal oscillator 100, and is electrically connected to the crystal oscillator 100 through one or more pads P1 and P2. The pads P1 and P2 may be referred to as crystal input/output pads. However, example embodiments are not limited thereto. The crystal XTAL may be inside the crystal oscillator 100. The crystal oscillator 100 may include a quartz crystal, a piezoelectric crystal, a piezoelectric crystal vibrator, and/or other various types of resonance elements.

The crystal oscillator 100 may include an oscillation circuit 110, which may generate an oscillation signal having a frequency corresponding to the natural frequency of the crystal XTAL. According to example embodiments, the oscillation circuit 110 may include a transconductance circuit 111, load capacitors C1 and C2 including at least one variable capacitor, and/or a feedback resistance circuit R. According to an implementation, the transconductance circuit 111 may include at least one metal-oxide semiconductor (MOS) transistor, for example, operating in a saturated area and having the function of an amplifier. The level of current (e.g., drain current) output from the transconductance circuit 111 may vary with a voltage level applied to a gate electrode of the transconductance circuit 111 according to a transconductance of the transconductance circuit 111. A circuit including the transconductance circuit 111 may be referred to as a Gm cell. For example, the Gm cell may defined as including the transconductance circuit 111 and the feedback resistance circuit R.

The crystal oscillator 100 may be implemented in various forms. For example, the crystal oscillator 100 may be implemented in a separate semiconductor chip. According to semiconductor processes, the crystal oscillator 100 may be implemented in a semiconductor chip at various levels such as a die level and a packaging level.

According to example embodiments, the feedback resistance circuit R may provide a bias voltage in the oscillation circuit 110, and the load capacitors C1 and C2 may be provided for compensation for a divergence of the crystal XTAL or a temperature change. For example, the crystal oscillator 100 may include a digitally controlled crystal oscillator. The digitally controlled crystal oscillator may compensate for a divergence of the crystal XTAL using a capacitor-based digital-to-analog converter. For example, the oscillation circuit 110 may include at least one switch, which is connected to the load capacitors C1 and C2, and digitally controlled to change a capacitance. The switch may be controlled by a control signal from a control circuit (not shown) of the crystal oscillator 100 or from a device outside the crystal oscillator 100. Accordingly, frequency trimming through digital control may be performed, and therefore, a frequency offset may be reduced. For example, when a frequency range of −30 to 30 ppm is required or desired, the crystal oscillator 100 may secure this frequency range by performing frequency trimming using the load capacitors C1 and C2.

Although the load capacitors C1 and C2 are included in the crystal oscillator 100 in FIG. 1, the load capacitors C1 and C2 may be outside the crystal oscillator 100 according to example embodiments.

The phase noise performance of the crystal oscillator 100 may be determined by the influence of peripheral circuit noise with respect to the amplitude of a sine wave signal generated by the crystal oscillator 100. For example, the transconductance of the transconductance circuit 111 may depend on the load capacitors C1 and C2. When the capacitance of the load capacitors C1 and C2 is a maximum or high level, the amplitude of the sine wave signal may decrease. When the amplitude of the sine wave signal decreases, the noise of feedback resistance used for a bias voltage of a Gm cell may cause phase noise degradation. For example, the clock signal CLK_R of the crystal oscillator 100 may be used as an input clock signal of a high-frequency clock generator (e.g., a phase-locked loop (PLL)). To ensure the high performance, or improve the performance, of clock generators, low-phase-noise performance of the crystal oscillator 100 is desired.

According to example embodiments, the crystal oscillator 100 may perform an efficient feedback resistance control operation to prevent noise performance due to the load capacitors C1 and C2 from being degraded or reduce the amount of degradation. For example, the amplitude of a sine wave signal may be changed according to the capacitance of the load capacitors C1 and C2. Phase noise caused by a feedback resistance may be reduced by detecting the level of the sine wave signal using one reference voltage level and variably controlling a value of the feedback resistance in a period, in which a high feedback resistance is not required or used (e.g., crystal oscillator frequency changes, such as those resulting from a divergence or temperature of a crystal, may be effectively or sufficiently compensated for without the high feedback resistance in the period).

The feedback resistance circuit R may include a variable resistor. When the level of a sine wave signal has a value near a reference voltage level, a high feedback resistance is not required or used. For example, a resistance control operation may be performed during a period (hereinafter, referred to as a first period) around a 0-degree and/or 180-degree phase of a sine wave signal, to decrease the resistance value of the feedback resistance circuit R. For example, the crystal oscillator 100 may be configured to generate a pulse as a resistance control signal Ctrl_R during the first period and control the resistance value of the feedback resistance circuit R in response to the resistance control signal Ctrl_R. In other words, while the feedback resistance circuit R may have a relatively low resistance during the first period of a cycle of the clock signal CLK_R, the feedback resistance circuit R may have a relatively high resistance during the remaining second period of the cycle. When the amplitude of a sine wave decreases in a maximum-load or high-load capacitor, the first period of a cycle of the clock signal CLK_R may increase, and therefore, the average resistance value of the feedback resistance circuit R during the cycle of the clock signal CLK_R may decrease. As a result, phase noise performance may increase.

According to example embodiments, the crystal oscillator 100 may further include a buffer, a clock driver 130, and/or a variable resistance controller 140. FIG. 1 shows an alternating current (AC) buffer 120 as an example implementation of the buffer. The AC buffer 120 may convert a sine wave signal generated by the oscillation circuit 110 into a square wave signal, and the clock driver 130 may receive the square wave signal and output the clock signal CLK_R. According to an example implementation, the clock driver 130 may include a plurality of (e.g., "n") drivers, and "n" clock signals CLK_R[1:n] may be respectively output from "n" drivers. The "n" clock signals CLK_R[1:n] from the clock driver 130 may be provided to a plurality of external devices.

According to example embodiments, the variable resistance controller 140 may detect the first period described above, and, in response to a detection result, generate the resistance control signal Ctrl_R for controlling the resistance value of the feedback resistance circuit R. As an example implementation, the variable resistance controller 140 may be connected to at least one node of the AC buffer 120, may detect a level of a sine wave signal, may determine the first period by comparing the level of the sine wave signal with a reference level, and may generate, as the resistance control signal Ctrl_R, a signal having a pulse in the first period. For example, a period around a 0- and/or 180-degree phase of a sine wave signal may be determined as the first period, or a period in which the level of a sine wave signal is within a reference voltage level may be determined as the first period. Accordingly, the resistance value of the feedback resistance circuit R may be variably controlled when the crystal oscillator 100 generates a clock signal having a certain frequency. For example, the resistance value of the feedback resistance circuit R may be variably controlled during a cycle of a clock signal. According to example embodiments, the resistance value of the feedback resistance circuit R may be changed (e.g., by the resistance control signal Ctrl_R) while the frequency of the clock signal is constant (e.g., without changing the frequency of the clock signal).

According to example embodiments, when the capacitance of the load capacitors C1 and C2 increases, a Gm value of the transconductance circuit 111, according to crystal oscillation conditions, decreases according to Equation 1 below, and accordingly, a value of the feedback resistance that may cause degradation in phase noise performance decreases even when the amplitude of a sine wave signal decreases. As a result, degradation in overall phase noise performance may be decreased. For example, to prevent or reduce loss in amplitude of a sine wave signal generated by the crystal oscillator 100 and/or in gain of the transconductance circuit 111, a high feedback resistance of several megaohms (MOhm) is required or used but may cause high noise. However, according to example embodiments, overall phase noise performance may be increased by detecting a period, in which high feedback resistance is not required or used, and variably decreasing a value of the feedback resistance based on a detection result. In Equation 1 below, gm is a transconductance, $W_{X-O}$ is a resonant frequency, CL is a load capacitance, and Gm is a total impedance of the transconductance circuit 111.

$$G_m = -g_m/(w_{X-0}^2 C_L^2) \quad \text{[Equation 1]}$$

In the above examples, it has been described that the level of a sine wave signal is detected using a node of the AC buffer 120 to detect the first period and the other period (e.g., the second period) in a cycle of the clock signal CLK_R. However, example embodiments are not limited thereto. For example, the variable resistance controller 140 may detect a period, in which a relatively high feedback resistance is not required or used, as the first period based on a signal, which may be applied to at least one node of each of various circuits implemented to generate the clock signal CLK_R in the crystal oscillator 100.

Figure 2:
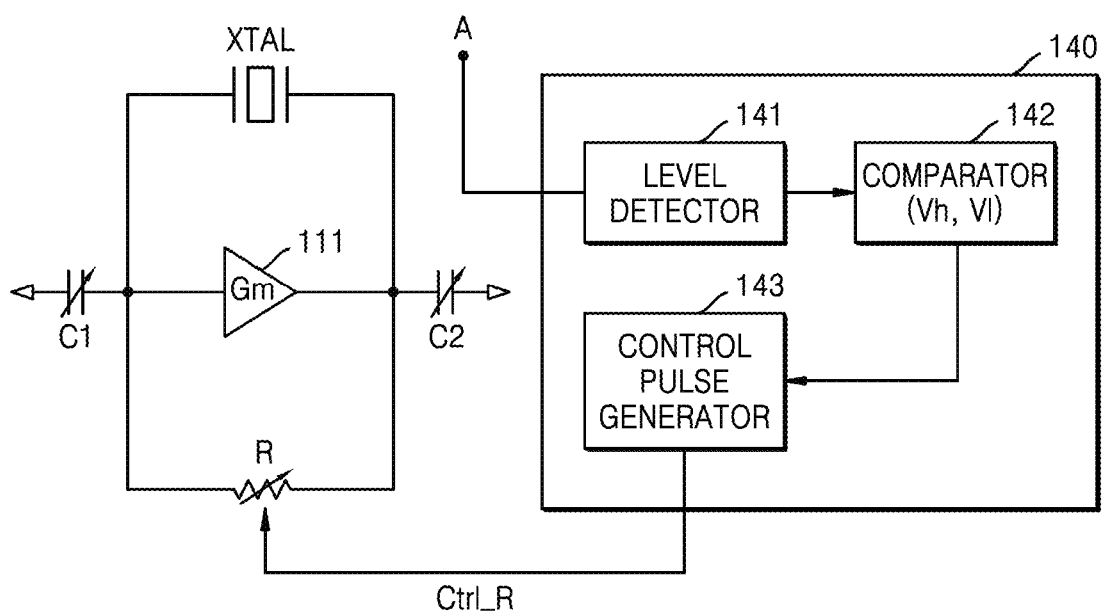
FIG. 2 is a block diagram illustrating an implementation of a variable resistance controller.

FIG. 2 is a block diagram illustrating an implementation of the variable resistance controller 140.

Referring to FIGS. 1 and 2, the variable resistance controller 140 may include a level detector 141, a comparator 142, and/or a control pulse generator 143. The level detector 141 may be connected to at least one node A selected from the oscillation circuit 110 and/or the AC buffer 120, and may detect the level of a sine wave signal based on a signal applied to the node A. In example embodiments, the level detector 141 may detect the level of a sine wave signal based on a signal of the AC buffer 120.

The comparator 142 may compare an output voltage of the level detector 141 with a reference voltage level and generate information indicating the first period described above. For example, the comparator 142 may compare the detected level of a sine wave signal with a first reference level Vh and a second reference level Vl. The first reference level Vh may be lower than a maximum value or high value (e.g., crest) of a sine wave signal by a certain rate (e.g., amount), and the second reference level Vl may be higher than a minimum value or low value (e.g., trough) of the sine wave signal by a certain rate (e.g., amount). Alternatively, the first reference level Vh may be a certain level higher than a common voltage level of a sine wave signal, and the second reference level Vl may be a certain level lower than the common voltage level.

The control pulse generator 143 may output a pulse signal, which has a pulse activated during the first period, as the resistance control signal Ctrl_R. For example, a period, in which the level of a sine wave signal is between the first reference level Vh and the second reference level Vl, may correspond to the first period, and the control pulse generator 143 may activate a pulse during the first period based on a comparison result of the comparator 142. For example, the feedback resistance circuit R may include a plurality of resistors, which provide a resistance component to the transconductance circuit 111. The resistors may be electrically connected to the transconductance circuit 111 through switches (not shown). According to example embodiments, the switches corresponding to the resistors may be controlled in response to the resistance control signal Ctrl_R, and the resistance value of the feedback resistance circuit R used as a feedback resistance may be changed by changing resistors electrically connected to the transconductance circuit 111.

Figure 3:
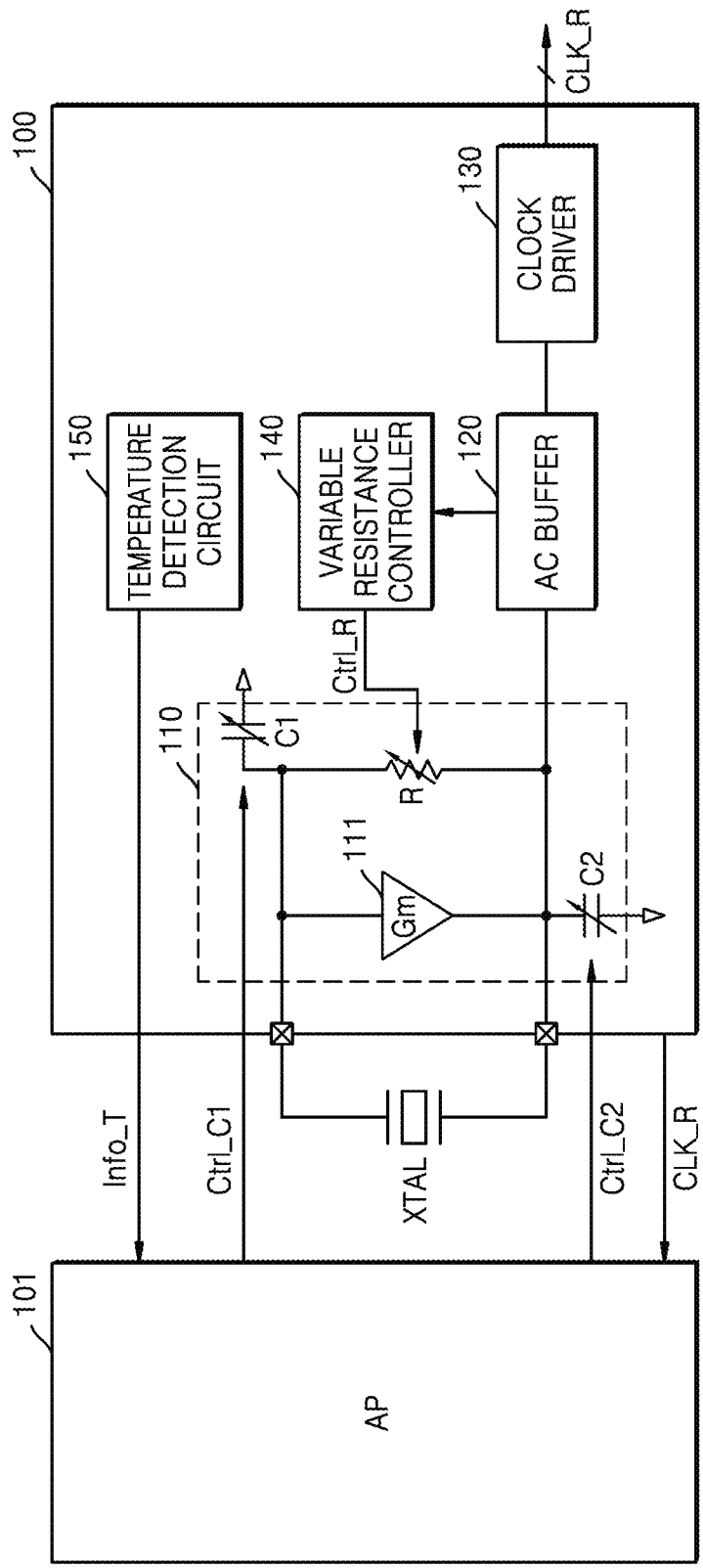
FIG. 3 is a block diagram of an example of controlling a crystal oscillator, according to example embodiments.

FIG. 3 is a block diagram of an example of controlling a crystal oscillator, according to example embodiments. Together with the crystal oscillator 100, FIG. 3 further illustrates an application processor (AP) 101 as an example of a device performing a control operation on the crystal oscillator 100. Although the AP 101 may control the load capacitors C1 and C2 in FIG. 3, the load capacitors C1 and C2 may be controlled by other various kinds of devices. When the AP 101 includes an element performing a modem function, the AP 101 may be referred to as a ModAP.

Referring to FIGS. 1 through 3, a frequency error may occur because of various causes such as a divergence of the crystal XTAL and/or a temperature change. To compensate for the frequency error, the capacitance of the load capacitors C1 and C2 may be adjusted. In an example operation, the AP 101 may receive the clock signal CLK_R from the crystal oscillator 100, detect the frequency of the clock signal CLK_R, and determine a frequency error. The AP 101 may generate and provide capacitor control signals Ctrl_C1 and Ctrl_C2 to the crystal oscillator 100 for frequency trimming. For example, when the clock signal CLK_R corresponds to a reference clock signal provided to a communication chip, the AP 101 may include information related to a communication frequency and provide the capacitor control signals Ctrl_C1 and Ctrl_C2 for frequency trimming based on the information.

As the capacitance of the load capacitors C1 and C2 changes, the amplitude of a sine wave signal generated by the crystal oscillator 100 may be changed, and accordingly, the phase noise performance of the crystal oscillator 100 may also be changed. According to the examples described above, the crystal oscillator 100 may detect the first period, in which a high feedback resistance is not required or used, by performing signal processing on a sine wave signal or a square wave signal based on the sine wave signal. The variable resistance controller 140 may generate the resistance control signal Ctrl_R based on a detection result and provide the resistance control signal Ctrl_R to the feedback resistance circuit R.

The AP 101 or a ModAP may communicate with an external base station through a communication network. In an example operation, in relation with compensation involved in a temperature change, a temperature detection circuit 150 for detecting a temperature change of the crystal XTAL may be provided inside or outside the crystal oscillator 100. FIG. 3 shows an example in which the temperature detection circuit 150 is provided inside the crystal oscillator 100. Temperature information Info_T may be provided from the temperature detection circuit 150 to the AP 101. The AP 101 may compensate for an error (e.g., an error in a frequency used for communication) occurring with respect to a base station by controlling the load capacitors C1 and C2 based on the temperature information Info_T. In an example operation, the AP 101 may include information related to a divergence of the crystal XTAL, and compensation may be performed through factory calibration when a system including the AP 101 is booted.

Figure 4A:
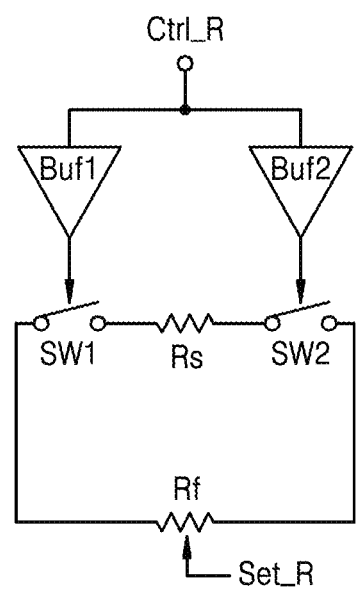
FIGS. 4A and 4B are diagrams showing an implementation of a feedback resistance circuit and an example of the waveform of a resistance control signal, respectively.
Figure 4B:
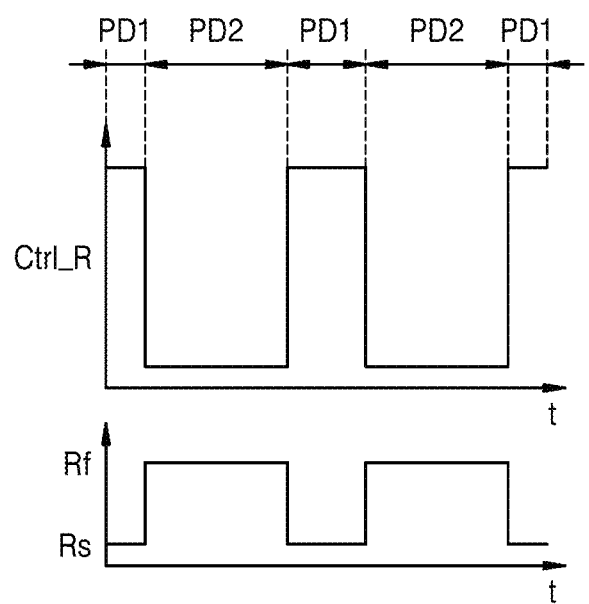

FIGS. 4A and 4B are diagrams showing an implementation of the feedback resistance circuit R and an example of the waveform of the resistance control signal Ctrl_R, respectively.

Referring to FIGS. 1 through 4A, the feedback resistance circuit R may include a first resistor Rf, which has a relatively high resistance value, and a second resistor Rs, which has a relatively low resistance value. The feedback resistance circuit R may further include a first switch SW1 and a second switch SW2 to control electrical connection between the second resistor Rs and the transconductance circuit 111. The resistance control signal Ctrl_R may be provided to the first switch SW1 and the second switch SW2 respectively through a first buffer Buf1 and a second buffer Buf2. In example embodiments, the first buffer Buf1 and the second buffer Buf2 may be included in the variable resistance controller 140 or provided outside the variable resistance controller 140.

The first resistor Rf may correspond to a main resistor and substantially provide a feedback resistance for bias generation to the transconductance circuit 111. According to example embodiments, the second resistor Rs may be provided for compensation for phase noise performance and thus be referred to as a compensation resistor. For convenience of description, an equivalent resistance by, or a similar resistance to, the first and second resistors Rf and Rs of the feedback resistance circuit R may be referred to as a feedback resistance provided to the transconductance circuit 111.

According to example embodiments, the resistance value of the first resistor Rf may be changed in response to a set signal Set_R. The crystal oscillator 100 may control the value of feedback resistance to be suitable for frequency ranges of various types of crystals. For example, the value of the feedback resistance may be increased or decreased according to the frequency of the clock signal CLK_R. For example, setting of the first resistor Rf may be performed according to a natural frequency of a crystal connected to the crystal oscillator 100. To prevent or reduce loss in amplitude of the clock signal CLK_R and/or in gain of the transconductance circuit 111, the first resistor Rf may have a sufficiently high resistance value. For example, the first resistor Rf may have a resistance of several MOhm, e.g., a resistance of about 1.5 MOhm for a 52 Mhz crystal or a resistance of about 3.2 MOhm for a 26 Mhz crystal.

According to example embodiments, the second resistor Rs may have a relatively lower resistance value than the first resistor Rf. For example, the second resistor Rs may have a resistance of about several hundred ohms or about several hundred kiloohms. When the second resistor Rs is selectively and electrically connected to the transconductance circuit 111 during the first period, according to the examples described above, and is connected in parallel to the first resistor Rf having a higher resistance value than the second resistor Rs, the resistance value of the feedback resistance circuit R may be decreased. When the second resistor Rs has a much lower resistance than the first resistor Rf, the resistance value of the feedback resistance circuit R may be substantially the same as or similar to that of the second resistor Rs because the second resistor Rs is connected in parallel to the first resistor Rf. In example embodiments, a setting operation may be performed such that a resistance ratio between the first resistor Rf and the second resistor Rs has a certain value. Accordingly, when the resistance value of the first resistor Rf is set in correspondence to the natural frequency of a crystal, a resistance setting operation may be performed such that the resistance value of the second resistor Rs varies with the resistance value of the first resistor Rf.

FIG. 4B shows the waveform of the resistance control signal Ctrl_R and the resistance value of the feedback resistance circuit R in a cycle of the clock signal CLK_R output from the crystal oscillator 100.

A first period PD1 and a second period PD2 may be detected according to the level of a sine wave signal. A period, in which an increasing level of the sine wave signal is between the second reference level Vl and the first reference level Vh, may be included in the first period PD1. A period, in which a decreasing level of the sine wave signal is between the first reference level Vh and the second reference level Vl, may also be included in the first period PD1. The remaining period of the cycle of the clock signal CLK_R excluding the first period PD1 (e.g., an entirety of the cycle excluding the first period) may correspond to the second period PD2. The resistance control signal Ctrl_R may include a pulse activated during the first period PD1, but example embodiments are not limited thereto. The resistance control signal Ctrl_R may have any one of various waveforms that distinguish the first period PD1 from the second period PD2.

According to example embodiments, the capacitance of the load capacitors C1 and C2, which is set to compensate for the divergence of the crystal XTAL, may be changed, and the level of a sine wave signal may be changed by the capacitance of the load capacitors C1 and C2. For example, when the peak level of a sine wave signal is high because the capacitance of the load capacitors C1 and C2 is set to be low, the level of the sine wave signal rapidly changes, and accordingly, the first period PD1 in a cycle of the clock signal CLK_R may be relatively short. Contrarily, when the peak level of a sine wave signal is low because the capacitance of the load capacitors C1 and C2 is set to be high, the first period PD1 in a cycle of the clock signal CLK_R may be relatively long. In other words, the length of each of the first period PD1 and the second period PD2 in a cycle of the clock signal CLK_R may vary with the capacitance of the load capacitors C1 and C2.

According to the examples described above, the resistance value of the feedback resistance circuit R may be set differently in each of the first period P1 and the second period PD2. When the feedback resistance circuit R of FIG. 4A is used, the resistance value of the feedback resistance circuit R in the second period PD2 may correspond to the first resistor Rf, and the resistance value of the feedback resistance circuit R in the first period PD1 may correspond to the second resistor Rs. In other words, according to example embodiments, the resistance value of the feedback resistance circuit R in a cycle of the clock signal CLK_R may be variably controlled.

According to example embodiments, because the resistance value of the feedback resistance circuit R in the first period PD1 decreases, an average resistance value of the feedback resistance circuit R in a cycle of the clock signal CLK_R may be calculated using Equation 2.

$$R'f = (1-k)Rf + kRs$$ [Equation 2]

In other words, according to example embodiments, the average resistance value of the feedback resistance circuit R in a cycle may be decreased, and accordingly, overall phase noise performance may be increased, as compared to the case where the first resistor Rf is fixedly used as a feedback resistor. At this time, in Equation 2, "k" may be a ratio of the first period PD1 to a cycle of the clock signal CLK_R. When the peak level of a sine wave signal is low, the first period PD1 is relatively long, and accordingly, "k" may be relatively great. In other words, according to example embodiments, phase noise performance may be adaptively managed by decreasing an average resistance value R'f of the feedback resistance circuit R when the phase noise performance is poor.

Figure 5:
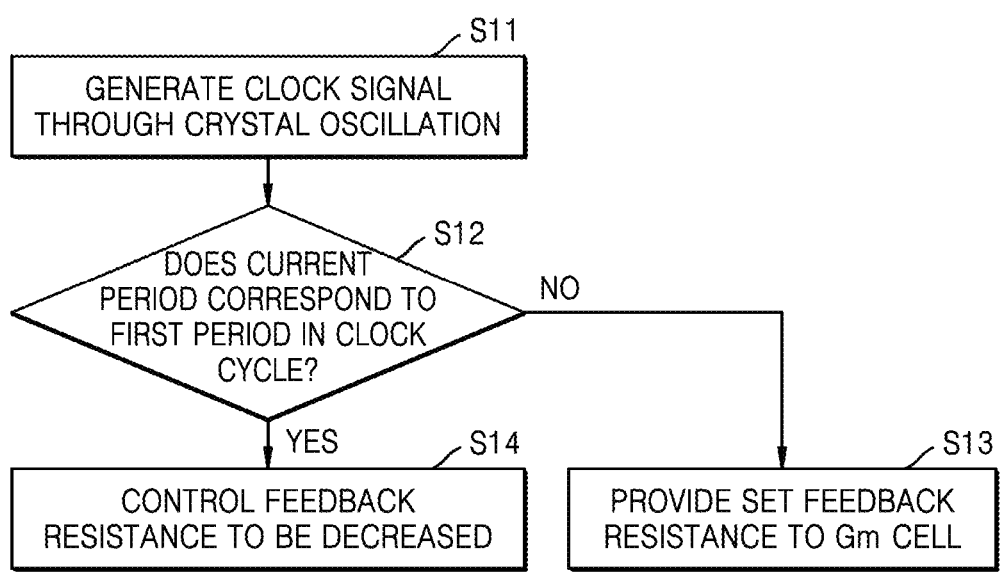
FIG. 5 is a flowchart of an operating method of a crystal oscillator, according to example embodiments.

FIG. 5 is a flowchart of an operating method of a crystal oscillator, according to example embodiments.

Referring to FIG. 5, a crystal oscillator (e.g., the crystal oscillator 100) according to example embodiments may be implemented in a semiconductor chip and may include an oscillation circuit (e.g., the oscillation circuit 110), which may generate an oscillation signal having a frequency corresponding to a natural frequency of a crystal (e.g., the crystal XTAL) outside or inside the semiconductor chip. The crystal oscillator may generate a clock signal through crystal oscillation in operation S11. The frequency of the clock signal may be changed by setting of various circuits of the oscillation circuit. For example, the value of feedback resistance, which is provided to a transconductance circuit of the oscillation circuit, may be set in correspondence to frequency setting. According to example embodiments, the oscillation circuit may include a feedback resistance circuit (e.g., the feedback resistance circuit R) providing the feedback resistance. A control operation may be performed on the feedback resistance circuit to reduce or eliminate phase noise.

The clock signal (e.g., the clock signal CLK_R) may be output based on the setting described above, and the resistance value of the feedback resistance circuit may be changed in a cycle of the clock signal, according to example embodiments. For example, whether a current period corresponds to the first period, in which a high feedback resistance is not required or used in a cycle of the clock signal, may be determined, according to the examples described above, in operation S12. In a period not corresponding to the first period, the set value of the feedback resistance may be provided to the transconductance circuit in operation S13.

Contrarily, when it is determined that the current period corresponds to the first period, a control operation may be performed such that the resistance value of the feedback resistance circuit is decreased and the decreased feedback resistance is provided to the transconductance circuit in operation S14 to reduce phase noise that may be caused by a high feedback resistance. According to the examples described above, together with a main resistor (e.g., the first resistor Rf) providing the set feedback resistance, an additional resistor (e.g., a compensation resistor, such as the second resistor Rs) having a lower resistance than that of the main resistor may also be provided. The resistance value may be decreased by selectively connecting the compensation resistor to the transconductance circuit.

Figure 6A:
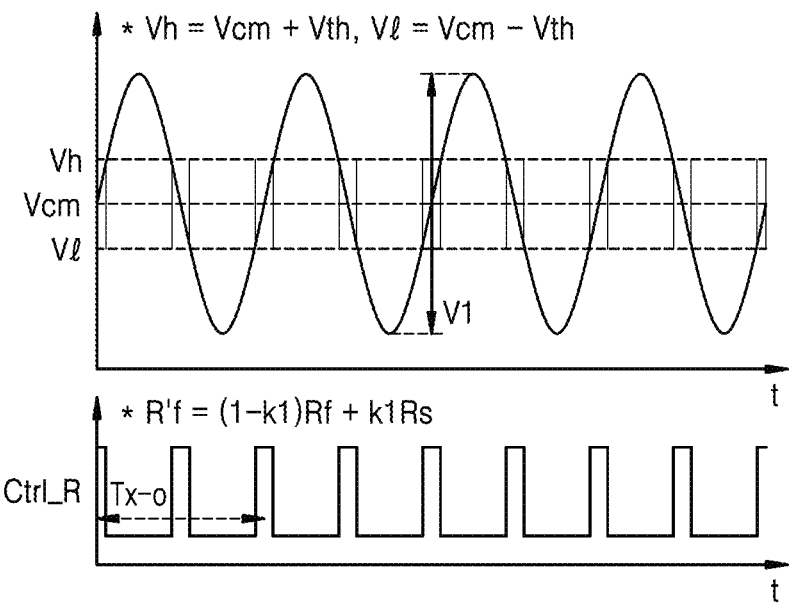
FIGS. 6A and 6B are diagrams of examples of a waveform change in a resistance control signal with respect to a capacitance change.
Figure 6B:
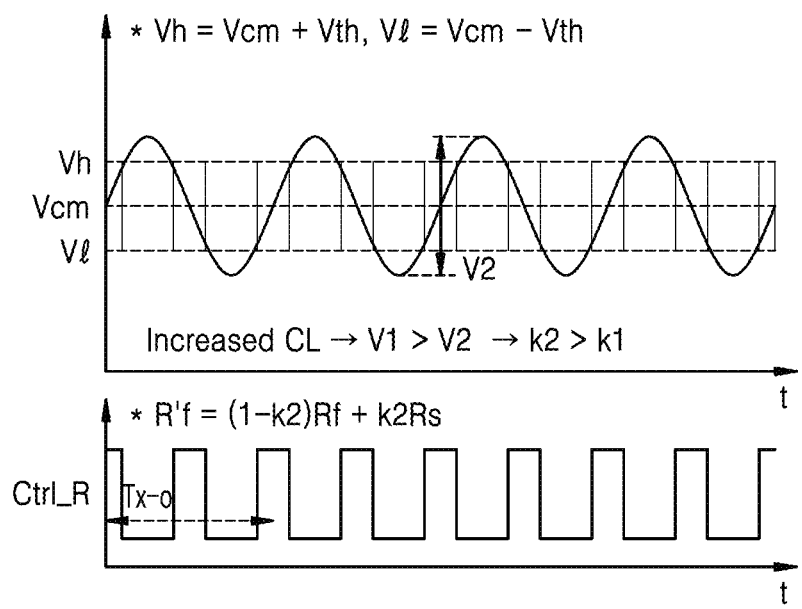

FIGS. 6A and 6B are diagrams of examples of a waveform change in a resistance control signal with respect to a capacitance change. FIG. 6A may show the case where the capacitance of a load capacitor connected to a transconductance circuit of a crystal oscillator is a minimum or low level, and FIG. 6B may show the case where the capacitance of the load capacitor connected to the transconductance circuit is a maximum or high level.

Referring to FIG. 6A, because the capacitance of a load capacitor CL is a minimum or low level, an amplitude Vl of a sine wave signal generated by an oscillation circuit may be relatively large, and a period having the level of the sine wave signal between the first reference level Vh and the second reference level Vl may be defined as the first period described above. In the graph shown in FIG. 6A, a voltage Vcm may correspond to a common voltage level. A level higher than the common voltage level Vcm by a threshold voltage Vth may correspond to the first reference level Vh, and a level lower than the common voltage level Vcm by the threshold voltage Vth may correspond to the second reference level Vl.

Because the sine wave signal has a waveform in which the level of the sine wave signal rapidly changes in a cycle $T_{X-O}$, the first period may be relatively short, and accordingly, a value k1 indicating a ratio of the first period to the cycle $T_{X-O}$ may be relatively small as compared to the case of FIG. 6B. When a feedback resistance circuit (e.g., the feedback resistance circuit R) is implemented as shown in FIG. 4A, the average resistance value R'f of the feedback resistance circuit, which is provided in the cycle $T_{X-O}$ of the sine wave signal, may have a value according to the Equation shown in FIG. 6A (e.g., R'f=(1−k1)Rf+k1Rs).

In the case of FIG. 6B, an amplitude V2 of a sine wave signal is relatively small, as compared to the case of FIG. 6A, as the capacitance of a load capacitor increases. Because the sine wave signal has a waveform in which the level of the sine wave signal slowly changes, the first period may be relatively long, and accordingly, a value k2 indicating a ratio of the first period to the cycle $T_{X-O}$ may be relatively large as compared to the case of FIG. 6A. In other words, when the amplitude of a sine wave signal decreases as the capacitance of the load capacitor CL increases, the value k2 indicating the ratio of the first period to the cycle $T_{X-O}$ may be greater than the value k1 in FIG. 6A. Because a period having a relatively low feedback resistance increases, the average resistance R'f in FIG. 6B (e.g., (1−k2)Rf+k2Rs) may be lower than the average resistance value R'f in FIG. 6A.

According to example embodiments, even when a crystal oscillator is vulnerable to the influence of a feedback resistance under the condition of high capacitance of the load capacitor CL, an average feedback resistance may be decreased by variably controlling the width of a pulse for reducing a feedback resistance, thereby minimizing or reducing degradation in phase noise performance. For example, after the load capacitor CL is set at initial boot, the load capacitor CL may be continuously controlled according to a temperature change such that an error caused by the temperature change may be compensated for. During the compensation, an average feedback resistance may be controlled such that phase noise involved in a change in the load capacitor CL may be adaptively reduced.

In the examples shown in FIGS. 6A and 6B, the first reference level Vh and the second reference level Vl may be set in other various manners. For example, as the level of a sine wave signal increases, a level difference between voltages respectively applied to opposite ends of a feedback resistance circuit may also increase, and accordingly, the level of current flowing through a feedback resistor may increase. A first period may be set taking into account the level of current flowing through the feedback resistor. For example, a period in which the level of current flowing through the feedback resistor is within a certain proportion (e.g., within 5%) of a maximum or high level current may be set as the first period.

Figure 7:
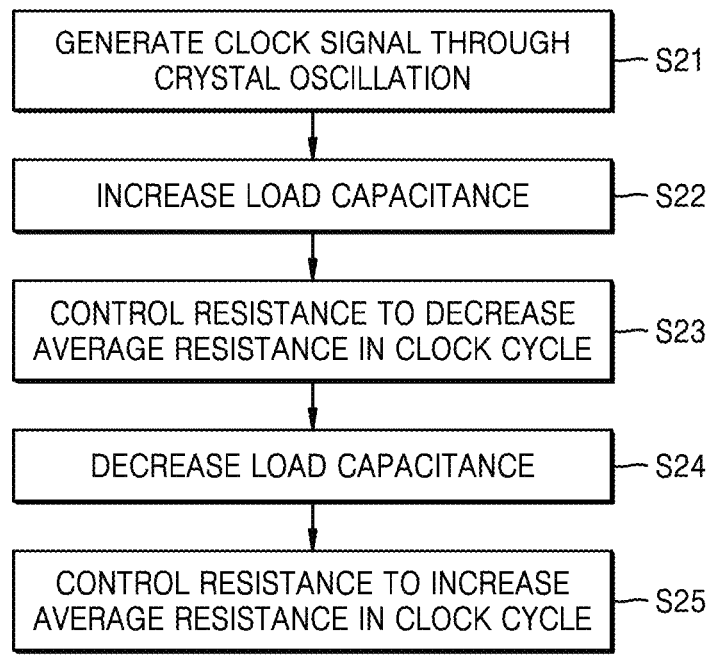
FIG. 7 is a flowchart of an example of an operating method of a crystal oscillator corresponding to FIGS. 6A and 6B.

FIG. 7 is a flowchart of an example of an operating method of a crystal oscillator corresponding to FIGS. 6A and 6B.

Referring to FIG. 7, according to example embodiment, the crystal oscillator (e.g., the crystal oscillator 100) may generate a clock signal through crystal oscillation in operation S21. To compensate for a frequency error in the clock signal output from the crystal oscillator, the capacitance of a load capacitor of the crystal oscillator may be periodically or non-periodically changed. For example, the frequency of the clock signal may be decreased by increasing the capacitance of the load capacitor in operation S22. When the capacitance is increased, the amplitude of a sine wave signal may be decreased, and accordingly, the phase noise performance may be degraded by a feedback resistance. According to example embodiments, the crystal oscillator may perform a resistance control operation to decrease the average resistance value of a feedback resistance circuit (e.g., the feedback resistance circuit R) in one clock cycle in response to the increase in the capacitance in operation S23.

The frequency of the clock signal output from the crystal oscillator may be increased by decreasing the capacitance of the load capacitor in operation S24. As compared to the case of a high capacitance, the amplitude of the sine wave signal may be relatively large. In this case, as compared to the case of a high capacitance, the degree of degradation in the phase noise performance may be small. The crystal oscillator may perform a resistance control operation to increase the average resistance value of the feedback resistance circuit in operation S25.

Figure 8:
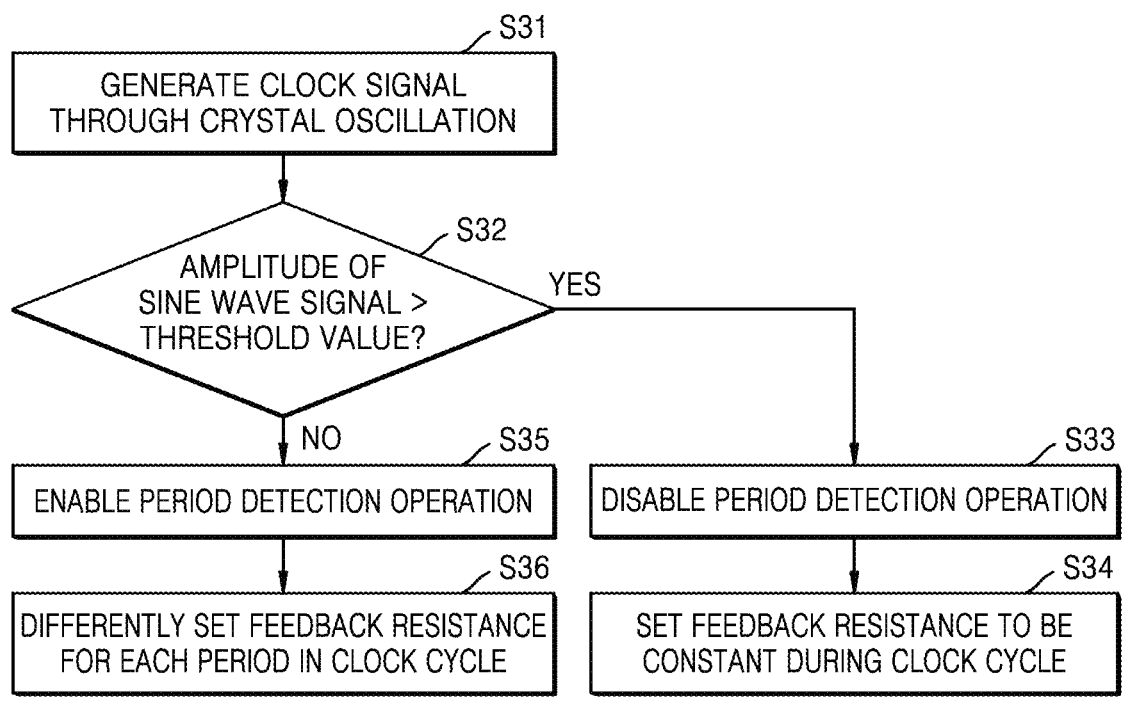
FIG. 8 is a flowchart of an operating method of a crystal oscillator, according to example embodiments.

FIG. 8 is a flowchart of an operating method of a crystal oscillator, according to example embodiments.

According to the examples described above, the phase noise performance of a crystal oscillator (e.g., the crystal oscillator 100) may be changed by controlling the capacitance of a load capacitor to compensate for a frequency error. When the amplitude of a sine wave signal is decreased with the increase in the capacitance of the load capacitor, the phase noise performance may be degraded by a high feedback resistance. For example, when the capacitance of a load capacitor is maintained to be lower than or equal to a certain level, the phase noise performance of a crystal oscillator may meet a desired level. According to example embodiments, an adaptive control operation of a feedback resistance circuit (e.g., the feedback resistance circuit R) may be selectively performed.

Referring to FIG. 8, the crystal oscillator may generate a clock signal through crystal oscillation, according to the examples described above, in operation S31. The clock signal may have a frequency characteristic according to the capacitance of a load capacitor. The amplitude of a sine wave signal generated by oscillation of a crystal circuit may be changed by the capacitance of the load capacitor. When the amplitude of the sine wave signal is decreased, the degree of degradation in phase noise performance caused by a high feedback resistance may be increased.

According to example embodiments, when the amplitude of a sine wave signal is lower than or equal to a certain level, adaptive control of a feedback resistance circuit may be selectively performed. For example, whether the amplitude of a sine wave signal is greater than a certain threshold value is determined in operation S32. When it is determined that the amplitude of the sine wave signal is greater than the threshold value, a period detection operation according to the examples described above may be disabled in operation S33. Accordingly, the adaptive control of the feedback resistance circuit is not performed, and the value of feedback resistance may be set to be constant during a cycle of the clock signal in operation S34.

Contrarily, when the amplitude of the sine wave signal is less than or equal to the threshold value, the period detection operation may be enabled in operation S35. Because the adaptive control of the feedback resistance circuit is performed, the value of the feedback resistance may be differently set for each period in a cycle of the clock signal in operation S36. For example, in a period (e.g., the first period) not requiring or using a high feedback resistance, the value of the feedback resistance may be set to be relatively low. In the other period (e.g., the second period), the value of the feedback resistance may be set to be relatively high.

Figure 9:
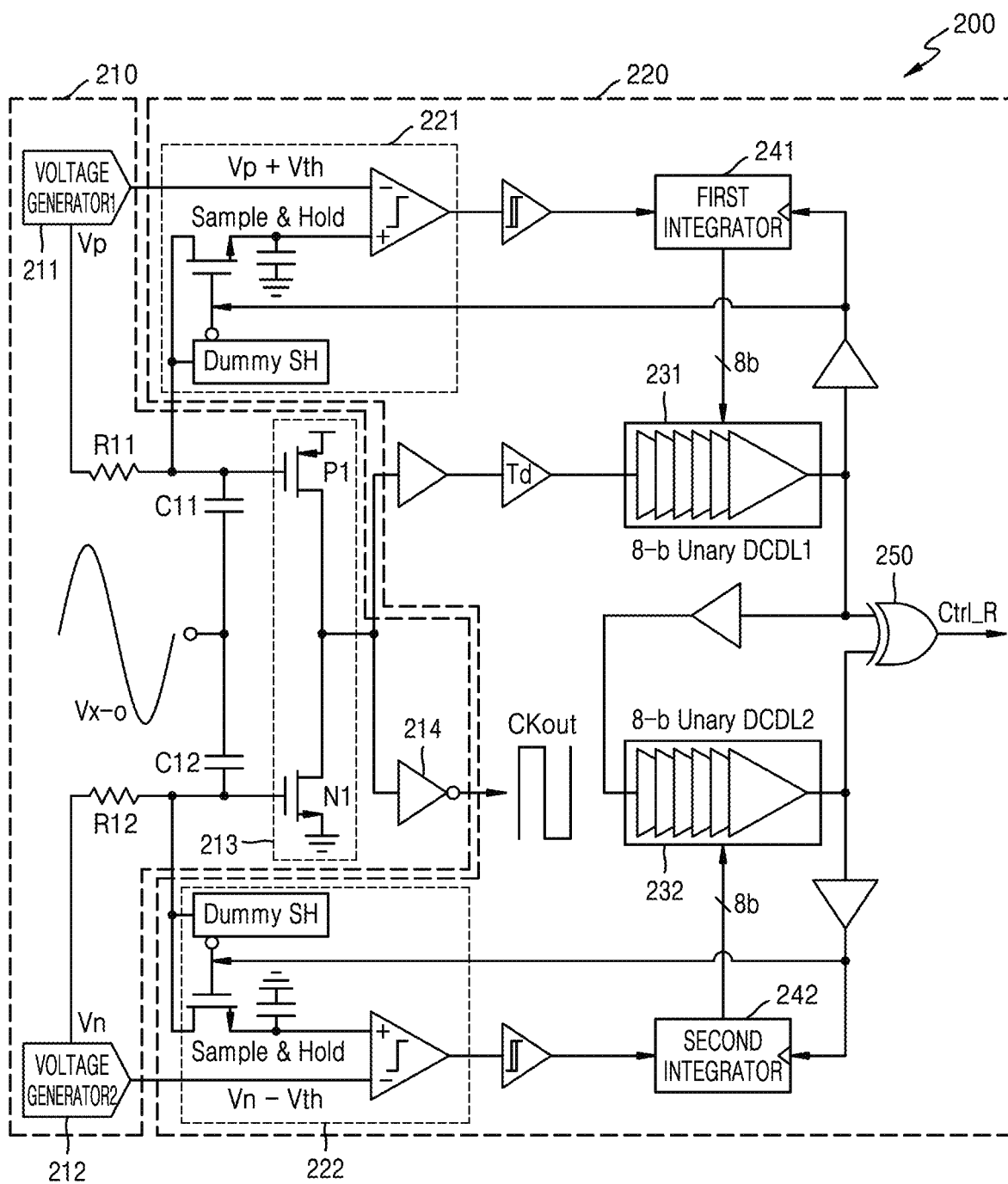
FIG. 9 is a diagram of a specific implementation of a crystal oscillator according to example embodiments.

FIG. 9 is a diagram of a specific implementation of a crystal oscillator according to example embodiments. FIG. 9 shows an example, in which a crystal oscillator 200 includes an AC buffer 210 and/or a variable resistance controller 220. For convenience of description, the illustration of other elements is omitted. FIG. 9 also shows circuits of at least one buffer and inverters included in the crystal oscillator 200. Detailed descriptions of the operations of these general circuits will be omitted. FIG. 9 shows transfer of various signals through an inverter or a buffer. However, example embodiments are not limited to the circuit configuration shown in FIG. 9. An inverter and a buffer may be arranged in various manners.

The AC buffer 210 may convert a sine wave signal, which is received from the oscillation circuit (not shown) described above, into a square wave signal, and may include one or more voltage generators 211 and 212, and inverters 213 and 214. A sine wave signal $V_{X-O}$ may be converted by the inverters 213 and 214 into a square wave signal CKout. For example, the sine wave signal $V_{X-O}$ having direct current (DC) voltages Vp and Vn may be generated by one or more AC coupling capacitors C11 and C12, and DC bias resistors R11 and R12, which are connected to a gate of a P-channel metal-oxide semiconductor (PMOS) transistor P1 and a gate of an N-channel MOS (NMOS) transistor, provided to the inverter 213, and converted into the square wave signal CKout by the inverters 213 and 214.

Each of the voltage generators 211 and 212 may include a resistor-based digital-to-analog converter (DAC), which may output a voltage having a certain level in response to a digital signal. For example, FIG. 9 shows an example, in which the voltage generator 211 generates a DC voltage having a Vp level and the voltage generator 212 generates a DC voltage having a Vn level. In the example, the level of the sine wave signal $V_{X-O}$ is detected in a half cycle (e.g., a phase of 0 degrees to 180 degrees) of the sine wave signal using a sine wave signal having the Vp level as a common voltage level, and the level of the sine wave signal $V_{X-O}$ is detected in the other half cycle (e.g., a phase of 180 degrees to 360 degrees) of the sine wave signal using a sine wave signal having the Vn level as the common voltage level. However, example embodiments are not limited thereto. Sine wave signals having the same level as, or a similar level to, the common voltage level may be used.

The variable resistance controller 220 may include various circuits to detect the level of the sine wave signal $V_{X-O}$ and to generate the resistance control signal Ctrl_R. In an example implementation, the variable resistance controller 220 may include a first comparator circuit 221, which compares the level of the sine wave signal $V_{X-O}$ with a first reference voltage Vp+Vth, and a second comparator circuit 222, which compares the level of the sine wave signal $V_{X-O}$ with a second reference voltage Vn−Vth. Each of the first and second comparator circuits 221 and 222 may include a comparator, and a sample and hold circuit, and may further include a dummy sample and hold (SH) circuit. The variable resistance controller 220 may include a first digitally controlled delay line 231, which may delay a signal received through the inverter 213, and a delay circuit Td, and may further include a first integrator 241, which may generate a control code 8b for controlling the first digitally controlled delay line 231. The first comparator circuit 221 may perform a comparison operation by performing a sample and hold operation in response to an output of the first digitally controlled delay line 231.

The variable resistance controller 220 may include a second digitally controlled delay line 232, which may delay the output of the first digitally controlled delay line 231, and further include a second integrator 242, which may generate a control code 8b for controlling the second digitally controlled delay line 232. The second comparator circuit 222 may perform a comparison operation by performing a sample and hold operation in response to an output of the second digitally controlled delay line 232. The variable resistance controller 220 may further include an operator 250, which may perform an operation on the output of the first digitally controlled delay line 231 and the output of the second digitally controlled delay line 232, and output the resistance control signal Ctrl_R. According to example embodiments, the operator 250 may include an XOR operator.

An example operation of the crystal oscillator 200 of FIG. 9 is described below.

The first comparator circuit 221 may sample the sine wave signal $V_{X-O}$ through the gate of the PMOS transistor P1, compare a sampling result (e.g., a first sample of the sine wave signal) with the first reference voltage Vp+Vth, and output a comparison result. The first integrator 241 may output the control code 8b, which may control the amount of delay of the first digitally controlled delay line 231, based on the comparison result. The first digitally controlled delay line 231 may delay the output of the inverter 213. The comparison and delay operations may be repeated so that the level of a sampled sine wave signal reaches the first reference voltage Vp+Vth.

As the level of the sampled sine wave signal reaches (e.g., becomes equal or similar to) the first reference voltage Vp+Vth, the comparison result may be changed. At the changing timing of the comparison result, a delay operation of the first digitally controlled delay line 231 may be locked (e.g., by the first integrator 241). In the locked state, the output of the first digitally controlled delay line 231 may be provided to the second digitally controlled delay line 232, and the amount of delay of the second digitally controlled delay line 232 may be controlled in response to the control code 8b from the second integrator 242. The second comparator circuit 222 may sample the sine wave signal $V_{X-O}$ through the gate of the NMOS transistor N1, compare a sampling result with the second reference voltage Vn−Vth, and output a comparison result. The comparison and delay operations using the second reference voltage Vn−Vth may be repeated so that the level of a sampled sine wave signal reaches the second reference voltage Vn−Vth. At the timing when the comparison result from the second comparator circuit 222 is changed (e.g., when the sampled sine wave signal becomes equal or similar to the second reference voltage Vn−Vth), a delay operation of the second digitally controlled delay line 232 may be locked (e.g., by the second integrator 242).

Based on the operations described above, the timings respectively at which the level of the sine wave signal $V_{X-O}$ corresponds to the first reference voltage Vp+Vth and the second reference voltage Vn−Vth may be detected (e.g., by the first integrator 241, the second integrator 242 and/or the variable resistance controller 220). The operator 250 may perform an operation on the output of the first digitally controlled delay line 231 and the output of the second digitally controlled delay line 232, and output the resistance control signal Ctrl_R.

In the example of FIG. 9, the dummy SH circuits are provided to allow a load applied to the first comparator circuit 221 to be the same as or similar to a load applied to the second comparator circuit 222. The sample and hold circuits and the dummy SH circuits may selectively operate. In the example of FIG. 9, each of the first and second digitally controlled delay lines 231 and 232 may be controlled by an 8-bit digital signal, but example embodiments are not limited thereto and may be implemented in various forms.

Figure 10:
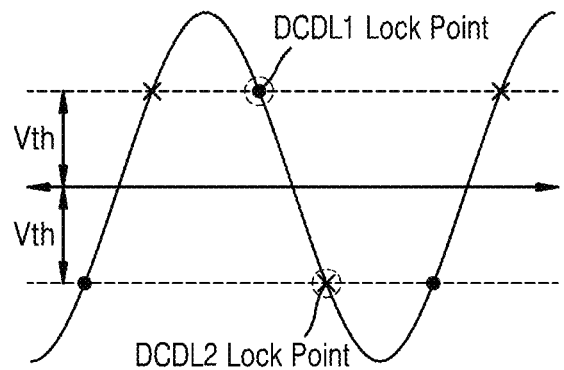
FIG. 10 is a waveform diagram showing an example operation of the crystal oscillator of FIG. 9.

FIG. 10 is a waveform diagram showing an example operation of the crystal oscillator 200 of FIG. 9.

FIG. 10 shows lock points of the first digitally controlled delay line (DCDL1) 231 and the second digitally controlled delay line (DCDL2) 232 in FIG. 9. The timing at which the level of a sine wave signal is higher than the voltage Vp by the threshold voltage Vth may be detected by the DCDL1 231, and the timing at which the level of a sine wave signal is lower than the voltage Vn by the threshold voltage Vth may be detected by the DCDL2 232. The resistance control signal Ctrl_R may be generated based on signals respectively from the DCDL1 and DCDL2 231 and 232.

According to example embodiments, because the resistance control signal Ctrl_R is generated by generating two pulses using both rising and falling edges of a square wave in a cycle of a clock signal generated by the crystal oscillator 200, an error may decrease as the duty cycle of a square wave signal used by the DCDL1 231 and DCDL2 232 gets closer to 50%. According to example embodiments, because the levels of the voltages Vp and Vn corresponding to bias voltages may be controlled using the voltage generators 211 and 212, the duty cycle characteristic may be enhanced, and accordingly, the pulse characteristic of the resistance control signal Ctrl_R may be enhanced. In addition, even when the levels of the voltages Vp and Vn corresponding to bias voltages are changed, the levels of the first and second reference voltages Vp+Vth and Vn−Vth may also be changed, and therefore, the pulse width of the resistance control signal Ctrl_R may be maintained constant or nearly constant. As a result, the pulse characteristic of the resistance control signal Ctrl_R may not be degraded or may be less degraded.

Figure 11:
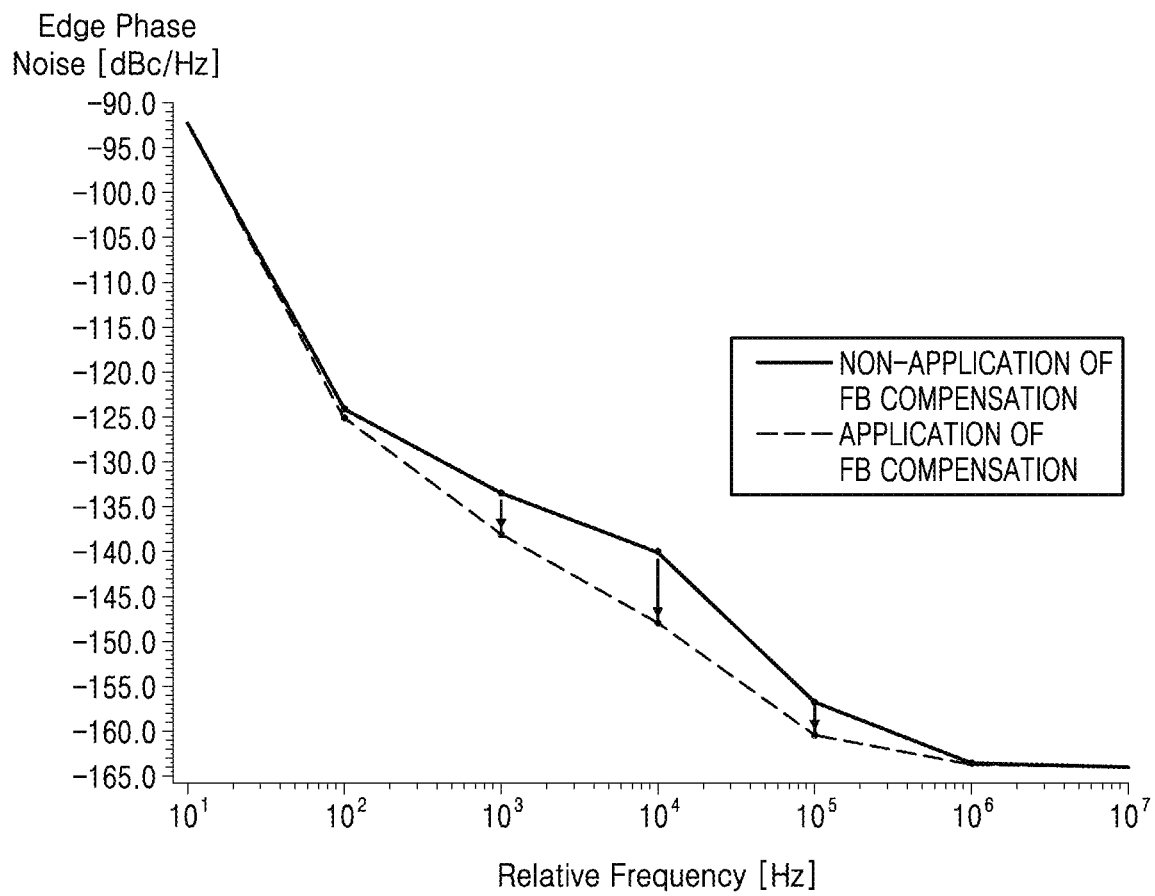
FIG. 11 is a waveform diagram showing an example characteristic of a crystal oscillator, according to example embodiments.

FIG. 11 is a waveform diagram showing an example characteristic of a crystal oscillator, according to example embodiments. FIG. 11 shows a phase noise characteristic when the amplitude of a sine wave signal is relatively small (e.g., in the case of a 0.6 V sine wave signal).

As shown in FIG. 11, when example embodiments are applied (may also be referred to as feedback (FB) compensation), the phase noise characteristic may be enhanced throughout a frequency range. For example, in the graph of FIG. 11, the horizontal axis is a frequency offset, and the vertical axis is a phase noise per hertz (Hz). It may be seen that the phase noise decreases throughout the frequency range. For example, phase noise performance may be enhanced by at least about −7.7 dBc/Hz and at least about −3.8 dBc/Hz, respectively, at frequency offsets of 10 kHz and 100 kHz under a maximum or high load condition.

Figure 12:
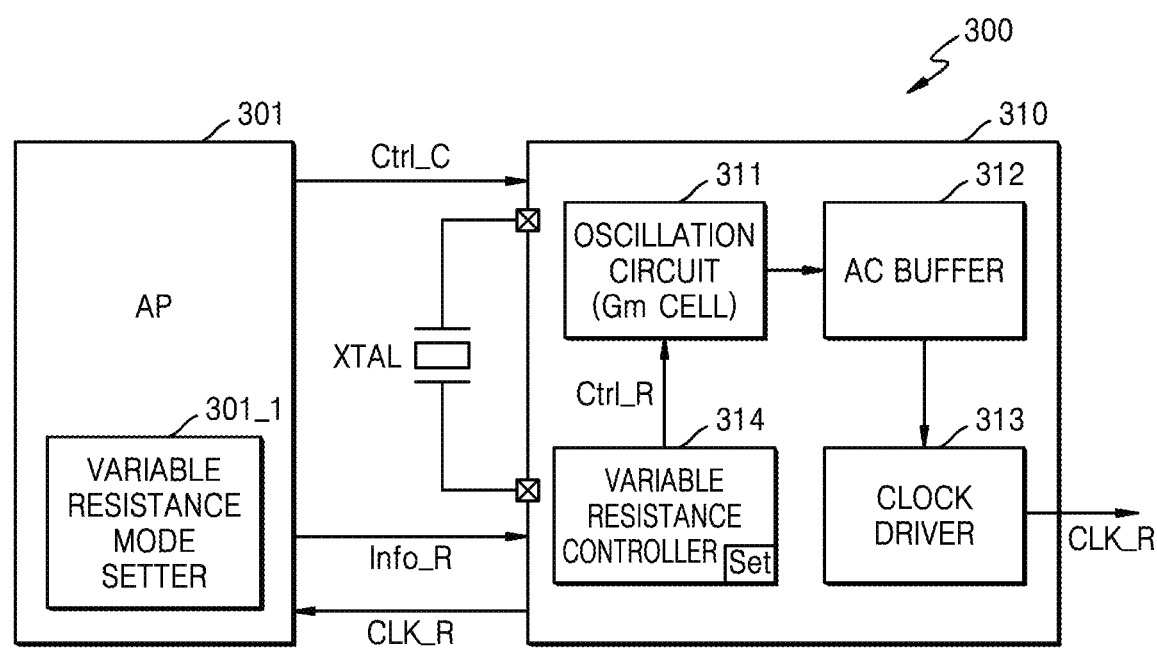
FIG. 12 is a block diagram of an example of controlling a crystal oscillator, according to example embodiments.

FIG. 12 is a block diagram of an example of controlling a crystal oscillator, according to example embodiments. FIG. 12 shows various examples of controlling a feedback resistance circuit included in a crystal oscillator 310.

Referring to FIG. 12, a system 300 including the crystal oscillator 310 may include at least one device that controls the crystal oscillator 310. An AP 301 is illustrated as this device in FIG. 12. According to example embodiments, the crystal oscillator 310 may include an oscillation circuit 311, an AC buffer 312, a clock driver 313, and/or a variable resistance controller 314. The oscillation circuit 311 may include a Gm cell including a transconductance circuit. Although not shown in FIG. 12, the oscillation circuit 311 may further include a load capacitor and a feedback resistance circuit.

The AP 301 may provide the crystal oscillator 310 with a capacitor control signal Ctrl_C for controlling the capacitance of the load capacitor of the oscillation circuit 311. For example, the AP 301 may receive a clock signal CLK_R and provide the capacitor control signal Ctrl_C to compensate for a frequency error. According to example embodiments, the AP 301 may periodically or non-periodically detect a frequency error in the clock signal CLK_R and provide the capacitor control signal Ctrl_C corresponding to the frequency error. For example, according to example embodiments, the system 300 may include a temperature detection circuit (not shown) that detects the temperature of a crystal XTAL, and the AP 301 may receive a temperature detection result, calculate a frequency error between the system 300 and a base station using the temperature detection result, and generate the capacitor control signal Ctrl_C.

According to example embodiments, when the capacitance of the load capacitor of the oscillation circuit 311 increases, the amplitude of a sine wave signal may decrease. When the amplitude of a sine wave signal is less than a certain level, a phase error of the crystal oscillator 310 may go beyond a tolerance limit. The AP 301 may determine the increase or decrease in the amplitude of a sine wave signal of the crystal oscillator 310 by generating and providing the capacitor control signal Ctrl_C, and may control the crystal oscillator 310 to selectively perform an operation of detecting the level of the sine wave signal and a variable resistance control operation, according to the examples described above, when the capacitance of the load capacitor is greater than a certain value.

According to example embodiments, the AP 301 may include a variable resistance mode setter 301_1 and may provide information Info_R for setting a variable resistance mode according to the capacitor control signal Ctrl_C provided to the crystal oscillator 310. According to the information Info_R, setting information Set indicating the variable resistance mode may be provided to the variable resistance controller 314. The variable resistance controller 314 may selectively perform an operation of changing a feedback resistance based on the setting information Set. In other words, according to example embodiments, the crystal oscillator 310 may detect the first and second periods of the clock signal CLK_R, and an operation of controlling a variable resistance based on a detection result may be performed by the AP 301.

Figure 13A:
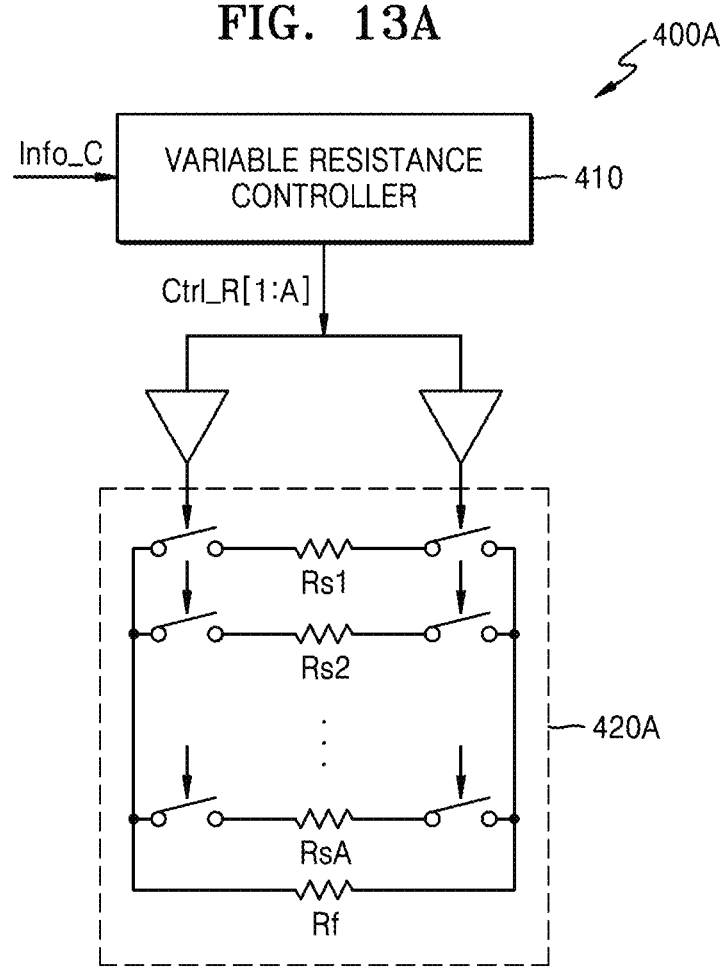
FIGS. 13A and 13B are circuit diagrams of implementations of a crystal oscillator, according to example embodiments.
Figure 13B:
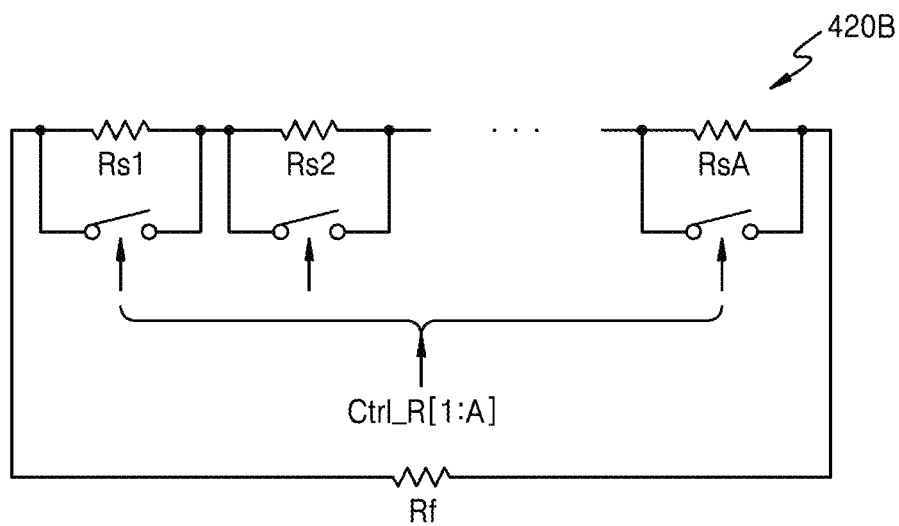

FIGS. 13A and 13B are respectively circuit diagrams of implementations of a crystal oscillator, according to example embodiments. FIGS. 13A and 13B show an example of controlling the resistance value of a feedback resistance circuit on multiple levels. For convenience of description, a feedback resistance circuit is illustrated in FIGS. 13A and 13B, and detailed illustration of other elements of a crystal oscillator is omitted.

Referring to FIG. 13A, a crystal oscillator 400A may include a variable resistance controller 410 and/or a feedback resistance circuit 420A. The feedback resistance circuit 420A may include a main resistor, e.g., a main feedback resistor Rf, which has a relatively high resistance value, and a plurality of compensation resistors Rs1 through RsA connected in parallel to the main feedback resistor Rf. Switches may be provided in correspondence to the compensation resistors Rs1 through RsA and switched in response to a resistance control signal Ctrl_R[1:A] from the variable resistance controller 410.

The variable resistance controller 410 may generate the resistance control signal Ctrl_R[1:A] based on various kinds of information and/or a detection operation. According to example embodiments, the variable resistance controller 410 may generate the resistance control signal Ctrl_R[1:A] using at least one item of clock information Info_C, and control the resistance value of the feedback resistance circuit 420A on multiple levels based on the various kinds of information and/or the detection operation. For example, at least one of the compensation resistors Rs1 through RsA may be connected in parallel to the main feedback resistor Rf in response to the resistance control signal Ctrl_R[1:A] so that the resistance value may be controlled.

According to the examples described above, the variable resistance controller 410 may determine the first period and the second period based on a result of sensing the level of a sine wave signal. In the first period, at least one of the compensation resistors Rs1 through RsA may be connected in parallel to the main feedback resistor Rf. The clock information Info_C may include various kinds of information related to clock generation of the crystal oscillator 400A. Based on the various kinds of information, at least one compensation resistor to be connected in parallel to the main feedback resistor Rf may be selected from the compensation resistors Rs1 through RsA. For example, the resistance value of the main feedback resistor Rf may be differently set according to the frequency of a clock signal, and the resistance control signal Ctrl_R[1:A] may be generated based on the set resistance value of the main feedback resistor Rf. The value of feedback resistance may be variously controlled on multiple levels based on the capacitance of a load capacitor or the amplitude of a sine wave signal, or according to a tolerable limit of phase noise of the crystal oscillator 400A.

FIG. 13B shows a modification of the feedback resistance circuit 420A. As shown in FIG. 13B, a feedback resistance circuit 420B may include the main feedback resistor Rf and the compensation resistors Rs1 through RsA connected in series to each other. The compensation resistors Rs1 through RsA may be connected in parallel to the main feedback resistor Rf and switched in response to the resistance control signal Ctrl_R[1:A].

According to the examples described above, a resistor having a relatively low resistance value may be connected in parallel to the main feedback resistor Rf in the first period, and at least one compensation resistor to be connected in parallel to the main feedback resistor Rf may be selected from the compensation resistors Rs1 through RsA in response to the resistance control signal Ctrl_R[1:A]. The compensation resistors Rs1 through RsA may have different resistance values from each other, and different numbers of compensation resistors may be selected by the resistance control signal Ctrl_R[1:A], so that the feedback resistance of the feedback resistance circuit 420B may be controlled on multiple levels.

Figure 14:
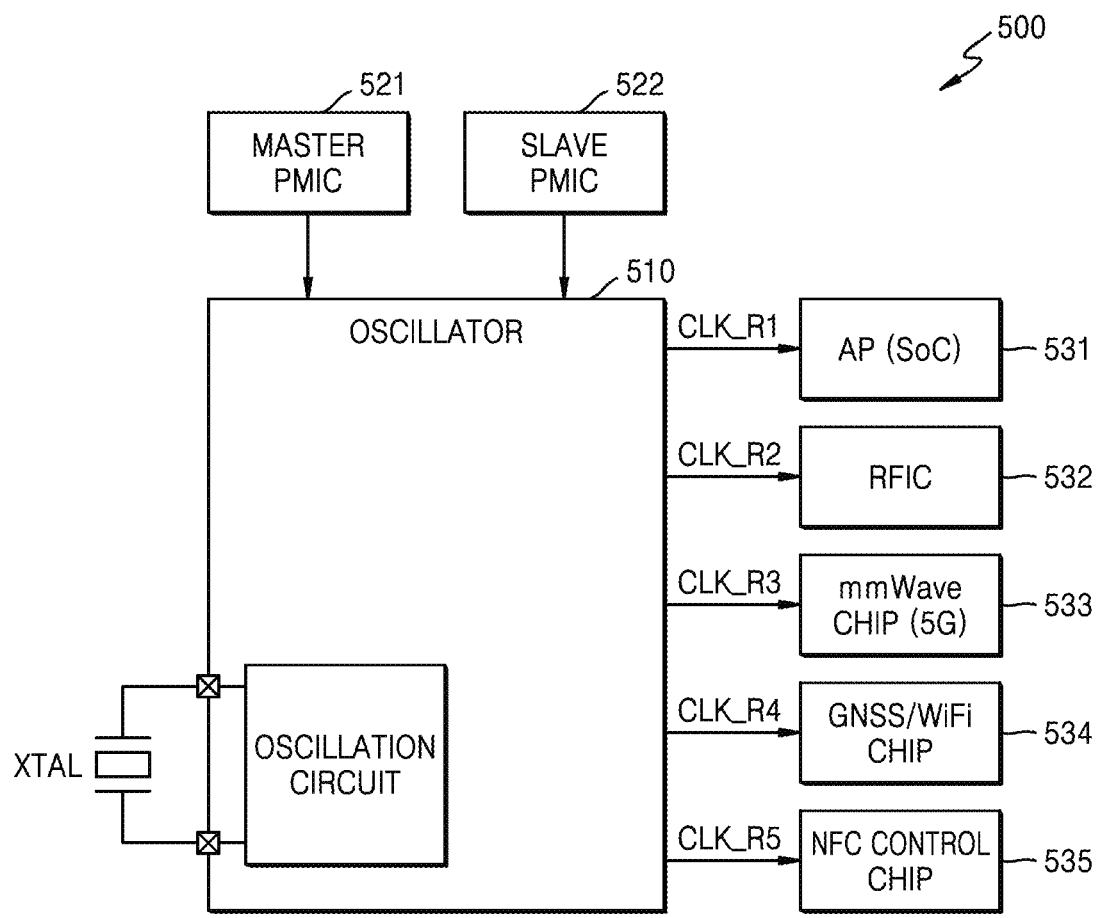
FIG. 14 is a block diagram of an electronic system including an oscillator, according to example embodiments.

FIG. 14 is a block diagram of an electronic system including an oscillator, according to example embodiments.

Referring to FIG. 14, an electronic system 500 may include an oscillator (or a crystal oscillator 510) according to the examples of FIGS. 1 through 13B. The crystal oscillator 510 may include an oscillation circuit, and the feedback resistance control described above in the examples may be applied to a feedback resistance circuit included in the oscillation circuit. The crystal oscillator 510 may receive at least one power supply voltage and may be connected to a master power management integrated circuit (PMIC) 521 and a slave PMIC 522.

The crystal oscillator 510 may respectively provide clock signals CLK_R1 through CLK_R5 to a plurality of external devices (or external chips). According to the examples described above, the crystal oscillator 510 may include a plurality of clock drivers (not shown), and each of the clock drivers may provide a clock signal to a corresponding external device.

The electronic system 500 may include various kinds of devices. For example, the electronic system 500 may include an AP (or a system-on-chip (SoC)) 531. According to the examples described above, the AP 531 may receive the clock signal CLK_R1 from the crystal oscillator 510 and output a control signal (not shown) for controlling a load capacitor of the crystal oscillator 510.

The electronic system 500 may include other various devices, and example embodiments are not limited to particular devices. As examples of the various devices, a radio frequency integrated circuit (RFIC) 532, a mmWave chip 533 for fifth-generation (5G) communication, a global navigation satellite system (GNSS)/WiFi chip 534, and a near field communication (NFC) control chip 535 are shown in FIG. 14. The crystal oscillator 510 may output a clock signal having various frequencies. For example, at least some of the clock signals CLK_R1 through CLK_R5 may have different frequencies from each other.

According to example embodiments, elements of the electronic system 500 may be mounted on one board. For example, the crystal oscillator 510 and a crystal XTAL may be separately mounted on a board, and the crystal oscillator 510 may be connected to the crystal XTAL through at least one pad and a wiring on the board.

Figure 15:
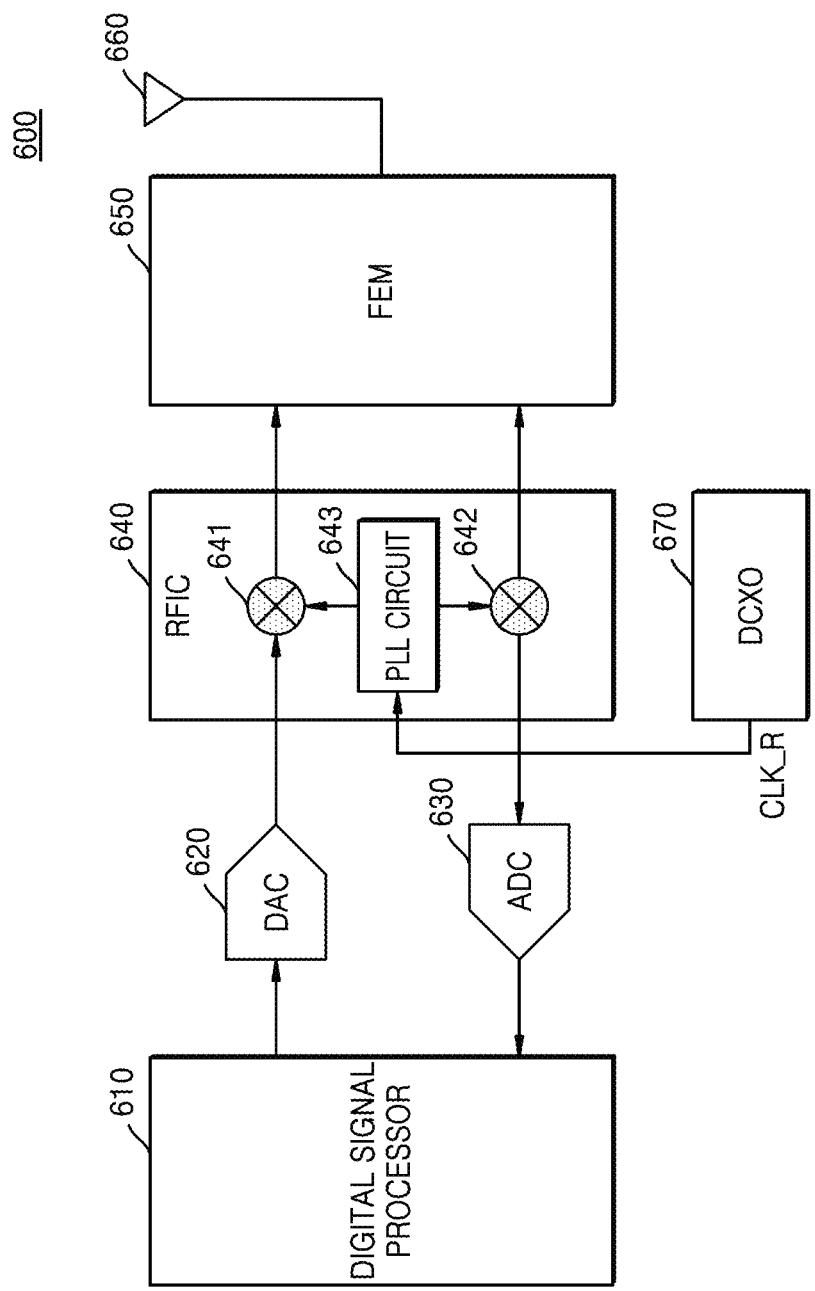
FIG. 15 is a block diagram of a wireless communication device including a crystal oscillator, according to example embodiments.

FIG. 15 is a block diagram of a wireless communication device including a crystal oscillator, according to example embodiments.

A wireless communication device 600 may include a digital signal processor 610, a digital-to-analog converter (DAC) 620, an analog-to-digital converter (ADC) 630, an RFIC 640, a front end module (FEM) 650, and/or an antenna 660. The wireless communication device 600 may further include a crystal oscillator 670 according to example embodiments. When the crystal oscillator 670 corresponds to a digitally controlled crystal oscillator (DCXO), the crystal oscillator 670 may include a digitally controlled load capacitor. According to the examples described above, the crystal oscillator 670 may generate a clock signal CLK_R, from which phase noise has been reduced based on feedback resistance control.

The digital signal processor 610 may process a signal, which includes information to be transmitted or received information, according to a set communication method. For example, the digital signal processor 610 may process a signal according to a communication method such as orthogonal frequency division multiplexing (OFDM), OFDM access (OFDMA), wideband code division multiple access (WCDMA), and/or high speed packet access+ (HSPA+).

The DAC 620 may convert a digital signal, including information to be transmitted, into an analog signal and may provide the analog signal to the RFIC 640. The ADC 630 may convert an analog signal received from the RFIC 640 into a digital signal and provide the digital signal to the digital signal processor 610.

The RFIC 640 may include a first mixer 641, a second mixer 642, and/or a PLL circuit 643. The RFIC 640 may generate an RF signal by up-converting the frequency of a baseband transmission signal, which is received from the DAC 620, using the first mixer 641 and the PLL circuit 643. The RFIC 640 may generate a baseband signal by down-converting the frequency of an RF receive signal, which is received from the FEM 650, using the second mixer 642 and the PLL circuit 643. The PLL circuit 643 may receive the clock signal CLK_R with improved phase noise from the crystal oscillator 670 according to the examples described with reference to FIGS. 1 through 14, and accordingly, the quality of an RF signal and a baseband signal, which are generated by the RFIC 640, may be increased or improved.

The FEM 650 may include an amplifier, a duplexer, or the like. The FEM 650 may amplify an RF receive signal from the RFIC 640 and transmit an amplified signal through the antenna 660. In example embodiments, the wireless communication device 600 may include a plurality of antennas 660, and the FEM 650 may separate an RF receive signal into different frequency bands and provide each frequency band to a corresponding antenna 660.

Figure 16:
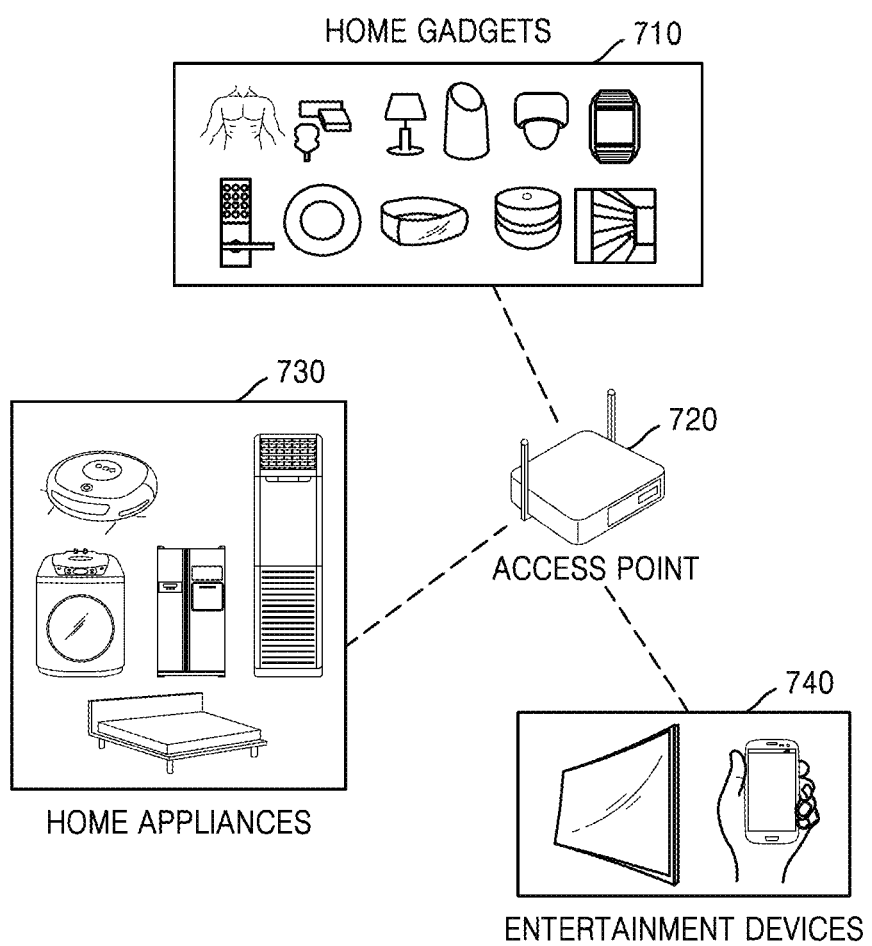
FIG. 16 is a diagram illustrating communication devices using a crystal oscillator, according to example embodiments.

FIG. 16 is a diagram illustrating communication devices using a crystal oscillator, according to example embodiments.

Referring to FIG. 16, each of home gadgets 710, home appliances 730, entertainment devices 740, and/or an access point 720 may include a clock generator, which may fix the phase of a clock signal. The clock generator may receive a reference clock signal from a crystal oscillator according to example embodiments and perform a phase fixing operation using the reference clock signal. In example embodiments, the home gadgets 710, the home appliances 730, the entertainment devices 740, and/or the access point 720 may form an Internet of things (IoT) network system. Communication devices shown in FIG. 16 are just examples. An oscillator according to example embodiments may be included in other communication devices not shown in FIG. 16.

Although it has been described above that a resistance control operation according to example embodiments may be applied to a crystal oscillator, the example described above may also be applied to other various devices. For example, example embodiments may be applied to various kinds of devices that include a Gm cell having a feedback resistance and use a signal generated by the Gm cell.

According to example embodiments, operations described herein as being performed by the crystal oscillator 100, the AC buffer 120, the clock driver 130, the variable resistance controller 140, the oscillation circuit 110, the transconductance circuit 111, the level detector 141, the comparator 142, the control pulse generator 143, the AP 101, the temperature detection circuit 150, the crystal oscillator 200, the AC buffer 210, the variable resistance controller 220, the first comparator circuit 221, the second comparator circuit 222, the first digitally controlled delay line 231, the first integrator 241, the second digitally controlled delay line 232, the second integrator 242, the operator 250, the system 300, the crystal oscillator 310, the AP 301, the oscillation circuit 311, the AC buffer 312, the clock driver 313, the variable resistance controller 314, the variable resistance mode setter 301_1, the crystal oscillator 400A, the variable resistance controller 410, the electronic system 500, the crystal oscillator 510, the AP 531, the wireless communication device 600, the digital signal processor 610, the DAC 620, the ADC 630, the RFIC 640, the FEM 650, the crystal oscillator 670, the first mixer 641, the second mixer 642, and/or the PLL circuit 643 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Conventional systems, devices and methods for implementing crystal oscillators control the capacitance of a capacitor to compensate for crystal oscillator frequency changes resulting from a divergence or temperature of a crystal. As the capacitance increases, the amplitude of a sine wave generated by the crystal oscillator decreases and a high resistance value is applied to prevent or reduce gain loss of a transconductance circuit. The high resistance value causes noise resulting in excessive phase noise in a reference clock signal output by the crystal oscillator.

However, according to example embodiments, improved systems, devices and methods are provided for implementing crystal oscillators. For example, according to example embodiments, in a first period around a 0-degree and/or 180-degree phase of the sine wave, a resistance control signal is generated causing a feedback resistance circuit to have a low resistance. Accordingly, the average resistance of the feedback resistance circuit is reduced, and thus, the noise generated by the feedback resistance circuit is reduced. Also, under conditions in which the capacitance of the capacitor increases, the first period is lengthened, and thus, the average resistance of the feedback resistance circuit and generated noise are further reduced. As the noise generated by the feedback resistance circuit is reduced, the phase noise in the reference signal output by the crystal oscillator is likewise reduced. Therefore, the improved systems, devices and methods of example embodiments overcome the deficiencies of the conventional systems, devices and methods to implement crystal oscillators outputting reference clock signals with reduced phase noise.

It will be understood that when an element is referred to as being "connected" or "coupled" to another element, it may be directly connected or coupled to the other element or intervening elements may be present. As used herein the term "and/or" includes any and all combinations of one or more of the associated listed items.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail above. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, or in some cases be performed in reverse order.

While the inventive concepts have been particularly shown and described with reference to example embodiments thereof, it will be understood that various changes in form and details may be made therein without departing from the spirit and scope of the following claims.

What is claimed is:

1. A crystal oscillator configured to output a clock signal, the crystal oscillator comprising:
   a transconductance circuit electrically connected to a crystal;
   a load capacitor connected to the transconductance circuit;
   a feedback resistance circuit connected between an input terminal of the
   transconductance circuit and an output terminal of the transconductance circuit, the feedback resistance circuit configured to provide a feedback resistance; and
   a variable resistance controller configured to generate a resistance control signal for controlling the feedback resistance, the resistance control signal causing the feedback resistance to have a first value in a first period and a second value in a second period, the first value being less than the second value, the first period corresponding to a first portion of a cycle of the clock signal, the second period corresponding to a second portion of the cycle different from the first portion, and the resistance control signal controlling an average resistance value of the feedback resistance circuit according to a capacitance of the load capacitor.

2. The crystal oscillator of claim 1, wherein
   the feedback resistance circuit includes a first resistor and a second resistor connected in parallel to each other, the first resistor having a first resistance value, and the second resistor having a second resistance value lower than the first resistance value; and
   the variable resistance controller is configured to cause the second resistor to be selectively connected to the transconductance circuit in the first period.

3. The crystal oscillator of claim 2, wherein
   the variable resistance controller is configured to cause the second resistor to be disconnected from the transconductance circuit in the second period; and
   the feedback resistance circuit is configured to provide a higher feedback resistance in the second period than in the first period.

4. The crystal oscillator of claim 1, wherein
   the transconductance circuit is configured to generate a sine wave signal based on an oscillation of the crystal; and
   the first period corresponds to a period in which a level of the sine wave signal is between a first reference level and a second reference level.

5. The crystal oscillator of claim 4, wherein the variable resistance controller is configured to:
   detect the level of the sine wave signal; and
   generate the resistance control signal based on the level of the sine wave signal, the resistance control signal being a control pulse activated during the first period.

6. The crystal oscillator of claim 1, further comprising:
   a buffer configured to convert a sine wave signal into a square wave signal, the sine wave signal being based on an oscillation of the crystal,
   wherein the variable resistance controller is configured to generate the resistance control signal by detecting the first period based on a signal applied to at least one node of the buffer.

7. The crystal oscillator of claim 6, wherein the variable resistance controller includes:
   a first digitally controlled delay line configured to perform a delay operation on the square wave signal;
   a first comparator circuit configured to,
      perform first sampling on the sine wave signal in response to an output of the first digitally controlled delay line to obtain a first sample of the sine wave signal, and
      compare the first sample of the sine wave signal with a first reference voltage to obtain a first comparison result; and
   a first integrator configured to,
      control the delay operation of the first digitally controlled delay line based on the first comparison result,
      detect a first timing at which a level of the first sample of the sine wave signal is equal to the first reference voltage, and
      lock the first digitally controlled delay line at the first timing.

8. The crystal oscillator of claim 7, wherein the variable resistance controller further includes:
   a second digitally controlled delay line configured to perform a delay operation on the output of the first digitally controlled delay line;
   a second comparator circuit configured to,
      perform second sampling on the sine wave signal in response to an output of the second digitally controlled delay line to obtain a second sample of the sine wave signal, and
      compare the second sample of the sine wave signal with a second reference voltage to obtain a second comparison result; and
   a second integrator configured to,
      control the delay operation of the second digitally controlled delay line based on the second comparison result,
      detect a second timing at which the level of the second sample of the sine wave signal is equal to the second reference voltage, and
      lock the second digitally controlled delay line at the second timing.

9. The crystal oscillator of claim 8, wherein the variable resistance controller includes an operator configured to generate the resistance control signal by performing an operation on the output of the first digitally controlled delay line and the output of the second digitally controlled delay line.

10. The crystal oscillator of claim 1, wherein
    the load capacitor is configured to change the capacitance of the load capacitor in response to a capacitor control signal from an external device; and
    the first period increases as the capacitance of the load capacitor increases.

11. The crystal oscillator of claim 10, wherein the resistance control signal causes the average resistance value of the feedback resistance circuit when the capacitance of the load capacitor is a first capacitance to be lower than the average resistance value of the feedback resistance circuit when the capacitance of the load capacitor is a second capacitance lower than the first capacitance.

12. The crystal oscillator of claim 1, wherein
the crystal oscillator is implemented in a semiconductor chip;
the crystal is outside the semiconductor chip; and
the transconductance circuit is connected to the crystal through at least one pad of the semiconductor chip.

13. A crystal oscillator configured to output a clock signal, the crystal oscillator comprising:
an oscillation circuit electrically connected to a crystal, the oscillation circuit including a load capacitor and a feedback resistance circuit, the load capacitor and the feedback resistance circuit being connected to a transconductance circuit, and the oscillation circuit configured to generate a sine wave signal by oscillating the crystal;
a buffer configured to convert the sine wave signal into a square wave signal; and
a variable resistance controller configured to generate a resistance control signal in response to a capacitance of the load capacitor, a resistance value of the feedback resistance circuit being based on the resistance control signal, the resistance control signal causing an average resistance value of the feedback resistance circuit when the load capacitor has a first capacitance to be lower than an average resistance value of the feedback resistance circuit when the load capacitor has a second capacitance, and the second capacitance being lower than the first capacitance.

14. The crystal oscillator of claim 13, wherein the resistance control signal causes the resistance value of the feedback resistance circuit in a first period to be less than the resistance value of the feedback resistance circuit in a second period, the first period corresponding to a first portion of a cycle of the clock signal, and the second period corresponding to a second portion of the cycle different from the first portion.

15. The crystal oscillator of claim 14, wherein the first period is longer when the load capacitor has the first capacitance than when the load capacitor has the second capacitance.

16. The crystal oscillator of claim 14, wherein
the first period corresponds to a period in which a level of the sine wave signal is between a first reference level and a second reference level; and
the second period corresponds to an entirety of the cycle of the clock signal excluding the first period.

17. The crystal oscillator of claim 14, wherein the feedback resistance circuit includes:
a first resistor connected between an input terminal of the transconductance circuit and an output terminal of the transconductance circuit, the first resistor having a first resistance value;
a second resistor connected in parallel to the first resistor, the second resistor having a second resistance value lower than the first resistance value; and
at least one switch configured to control an electrical connection between the second resistor and the transconductance circuit in response to the resistance control signal,
wherein the at least one switch is selectively turned on in the first period.

18. The crystal oscillator of claim 13, wherein the resistance control signal causes the resistance value of the feedback resistance circuit to change while a frequency of the clock signal is constant.

19. An electronic system comprising:
a crystal having a natural frequency;
a crystal oscillator connected to the crystal, the crystal oscillator configured to generate a clock signal having a frequency corresponding to the natural frequency; and
an application processor configured to control the crystal oscillator,
wherein
the crystal oscillator includes:
an oscillation circuit including a transconductance circuit, a load capacitor, and a feedback resistance circuit, the load capacitor being connected to the transconductance circuit, and the feedback resistance circuit providing a feedback resistance to the transconductance circuit, and
a variable resistance controller configured to decrease a value of the feedback resistance in a first period and increase the value of the feedback resistance in a second period, the first period corresponding to a first portion of a cycle of the clock signal, and the second period corresponding to a second portion of the cycle of the clock signal different from the first portion,
the application processor is configured to output a capacitor control signal for controlling a capacitance of the load capacitor, and
a length of the first period is changed when the capacitance of the load capacitor is changed.

20. The electronic system of claim 19, wherein
the oscillation circuit is configured to output a sine wave signal by oscillating the crystal; and
the crystal oscillator further includes:
a buffer configured to convert the sine wave signal into a square wave signal, and
a clock driver configured to receive the square wave signal from the buffer and provide the clock signal to at least one external device.

* * * * *